(12) United States Patent
Lee et al.

(10) Patent No.: US 11,462,703 B2
(45) Date of Patent: Oct. 4, 2022

(54) ORGANIC LIGHT-EMITTING DEVICE AND APPARATUS INCLUDING THE SAME

(71) Applicant: Samsung Display Co., Ltd., Yongin-si (KR)

(72) Inventors: Jungsub Lee, Yongin-si (KR); Minje Kim, Yongin-si (KR); Hyojeong Kim, Yongin-si (KR); Jiyoung Lee, Yongin-si (KR); Kunwook Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 302 days.

(21) Appl. No.: 16/707,653

(22) Filed: Dec. 9, 2019

(65) Prior Publication Data
US 2020/0373509 A1 Nov. 26, 2020

(30) Foreign Application Priority Data
May 23, 2019 (KR) .......................... 10-2019-0060810

(51) Int. Cl.
*H01L 51/00* (2006.01)
*H01L 51/50* (2006.01)
*H01L 51/52* (2006.01)

(52) U.S. Cl.
CPC ...... *H01L 51/5024* (2013.01); *H01L 51/0067* (2013.01); *H01L 51/0072* (2013.01); *H01L 51/5016* (2013.01); *H01L 51/5036* (2013.01); *H01L 51/5056* (2013.01); *H01L 51/5092* (2013.01); *H01L 51/5096* (2013.01); *H01L 51/5206* (2013.01); *H01L 51/5221* (2013.01); *H01L 51/5004* (2013.01); *H01L 51/5072* (2013.01)

(58) Field of Classification Search
None
See application file for complete search history.

(56) References Cited

U.S. PATENT DOCUMENTS

| | | | |
|---|---|---|---|
| 10,163,998 B2* | 12/2018 | Zhao | H01L 27/3276 |
| 2012/0080681 A1* | 4/2012 | Kim | H01L 27/1214 |
| | | | 257/E29.292 |
| 2016/0087227 A1 | 3/2016 | Kim et al. | |
| 2018/0323394 A1* | 11/2018 | Haldi | H01L 51/5036 |
| 2018/0323395 A1* | 11/2018 | Haldi | H01L 51/5028 |
| 2018/0337361 A1 | 11/2018 | Lee et al. | |

(Continued)

FOREIGN PATENT DOCUMENTS

| | | |
|---|---|---|
| CN | 108191853 | 6/2018 |
| CN | 108695440 | 10/2018 |

(Continued)

OTHER PUBLICATIONS

Liu et al. "Novel carbazol-pyridine-carbonitrile derivative as excellent blue thermally activated delayed fluorescence emitter for highly efficient organic light-emitting devices." ACS Applied Materials & Interfaces 2015, 7(34), 18903-18936. (Year: 2015).*

(Continued)

*Primary Examiner* — Robert S Loewe
(74) *Attorney, Agent, or Firm* — H.C. Park & Associates, PLC

(57) ABSTRACT

An organic light-emitting device and an apparatus including the organic light-emitting device.

20 Claims, 3 Drawing Sheets

(56) References Cited

U.S. PATENT DOCUMENTS

| | | |
|---|---|---|
| 2019/0115538 A1 | 4/2019 | Lim et al. |
| 2019/0203114 A1 | 7/2019 | Ihn et al. |
| 2019/0259959 A1 | 8/2019 | Duan et al. |
| 2020/0083460 A1 | 3/2020 | Duan et al. |
| 2020/0119286 A1* | 4/2020 | Liaptsis .............. H01L 51/5028 |
| 2020/0185616 A1* | 6/2020 | Baek ................... H01L 51/0072 |
| 2020/0235313 A1* | 7/2020 | Nakanotani ............. H01L 51/50 |
| 2021/0202864 A1* | 7/2021 | Nakanotani .......... C07D 209/88 |

FOREIGN PATENT DOCUMENTS

| | | | |
|---|---|---|---|
| JP | 2015172166 A * | 10/2015 | ............. C09K 11/06 |
| KR | 10-2016-0034528 | 3/2016 | |
| KR | 10-2017-0026075 | 3/2017 | |
| KR | 10-2018-0126655 | 11/2018 | |
| KR | 10-2018-0138422 | 12/2018 | |
| KR | 10-2019-0042791 | 4/2019 | |
| TW | 201835304 | 10/2018 | |

OTHER PUBLICATIONS

Extended European Search Report dated Aug. 5, 2020, issued in European Patent Application No. 20154432.7.
Brigita Vigante et al., Synthesis of Linear and V-Shaped Carbazolyl-Substituted Pyridine-3,5-dicarbonitriels Exhibiting Efficient Bipolar Charge Transport and E-type Fluorescence, Chemistry—A European Journal, Feb. 4, 2019, XP055717886, DE ISSN:0947-6539, DOI: 10.1002/chem.201805323.
Korean Notice of Allowance in KR Patent Application No. 10-2019-0060810.

* cited by examiner

| 190 |
| 150 |
| 110 |

| 190 |
| 150 |
| 110 |
| 210 |

| 220 |
| 190 |
| 150 |
| 110 |

| 220 |
| 190 |
| 150 |
| 110 |
| 210 |

ORGANIC LIGHT-EMITTING DEVICE AND APPARATUS INCLUDING THE SAME

CROSS REFERENCE TO RELATED APPLICATION

This application claims priority from and the benefit of Korean Patent Application No. 10-2019-0060810, filed on May 23, 2019, which is hereby incorporated by reference for all purposes as if fully set forth herein.

BACKGROUND

Field

Exemplary embodiments of the invention relate generally to an organic light-emitting device and an apparatus including the organic light-emitting device.

Discussion of the Background

Organic light-emitting devices (OLEDs) are self-emissive devices that, as compared with devices of the related art, have wide viewing angles, high contrast ratios, and short response times, and excellent characteristics in terms of luminance, driving voltage, and response speed. In addition, OLEDs may produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

The above information disclosed in this Background section is only for understanding of the background of the inventive concepts, and, therefore, it may contain information that does not constitute prior art.

SUMMARY

Devices constructed according to exemplary embodiments of the invention are capable of providing an organic light-emitting device and an apparatus including the organic light emitting device.

Additional features of the inventive concepts will be set forth in the description which follows, and in part will be apparent from the description, or may be learned by practice of the inventive concepts.

According to one or more embodiments, an organic light-emitting device may include a first electrode; a second electrode; and an organic layer between the first electrode and the second electrode, wherein the organic layer may include an emission layer, the emission layer may include a first compound, a second compound, and a third compound, the first compound may be represented by Formula 1, the second compound may be represented by Formula 2, the third compound may be represented by Formula 3, and the first compound, the second compound, and the third compound may be different from one another:

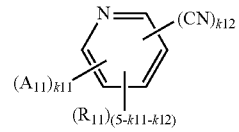

Formula 1

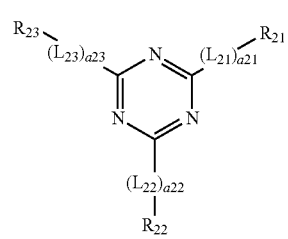

Formula 2

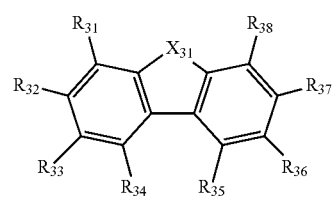

Formula 3 wherein in Formulae 1 to 3,
$A_{11}$ may be a group represented by Formula 10:

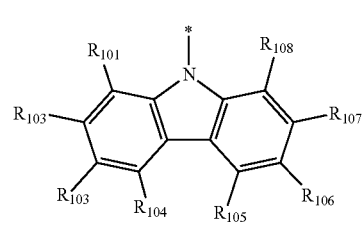

Formula 10 wherein, in Formula 10,
$R_{101}$ to $R_{108}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), k11 and k12 may each independently be selected from 1, 2, 3, and 4, $R_{11}$ may be selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C(Q$_1$)(Q$_2$)(Q$_3$), —Si(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), and —P(=S)(Q$_1$)(Q$_2$), L$_{21}$ to L$_{23}$ may each independently be selected from a $C_5$-$C_{15}$ carbocyclic group and a heterocyclic group having 1 to 15 ring-forming atoms, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_5$ aryl group, a $C_6$-$C_{15}$ aryloxy group, a $C_6$-$C_5$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C(Q$_{31}$)(Q$_{32}$)(Q$_{33}$), —Si(Q$_{31}$)(Q$_{32}$)(Q$_{33}$), —B(Q$_{31}$)(Q$_{32}$), —N(Q$_{31}$)(Q$_{32}$), —P(Q$_{31}$)(Q$_{32}$), —C(=O)(Q$_1$), —S(=O)(Q$_{31}$), —S(=O)$_2$(Q$_{31}$), —P(=O)(Q$_{31}$)(Q$_{32}$), and —P(=S)(Q$_{31}$)Q$_{32}$), a21 to a23 may each independently be selected from 0, 1, and 2, R$_{21}$ to R$_{23}$ may each independently be selected from a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, and a monovalent non-aromatic condensed heteropolycyclic group having 1 to 15 ring-forming atoms, unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C(Q$_{31}$)(Q$_{32}$)(Q$_{33}$), —Si(Q$_{31}$)(Q$_{32}$)(Q$_{33}$), —B(Q$_{31}$)(Q$_{32}$), —N(Q$_{31}$)(Q$_{32}$), —P(Q$_{31}$)(Q$_{32}$), —C(=O)(Q$_1$), —S(=O)(Q$_{31}$), —S(=O)$_2$(Q$_{31}$), —P(=O)(Q$_{31}$)(Q$_{32}$), and —P(=S)(Q$_{31}$)(Q$_{32}$), and —C(Q$_1$)(Q$_2$)(Q$_3$), —Si(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), and —P(=S)(Q$_1$)(Q$_2$), X$_{31}$ may be selected from N(R$_{39}$), and C(R$_{39}$)(R$_{40}$), R$_{31}$ to R$_{40}$ may each independently be selected from a group represented by *-(L$_{31}$)$_{a31}$-A$_{31}$, hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C(Q$_1$)(Q$_2$)(Q$_3$), —Si(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), and —P(=S)(Q$_1$)(Q$_2$), provided that at least one selected from R$_{31}$ to R$_{39}$ may be a group represented by *-(L$_{31}$)$_{a31}$-A$_{31}$, L$_{31}$ may be a phenylene group unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C(Q$_{31}$)(Q$_{32}$)(Q$_{33}$), —Si(Q$_{31}$)(Q$_{32}$)(Q$_{33}$), —B(Q$_{31}$)(Q$_{32}$), —N(Q$_{31}$)(Q$_{32}$), —P(Q$_{31}$)(Q$_{32}$), —C(=O)(Q$_1$), —S(=O)(Q$_{31}$), —S(=O)$_2$(Q$_{31}$), —P(=O)(Q$_{31}$)(Q$_{32}$), and —P(=S)(Q$_{31}$)(Q$_{32}$), a31 may be selected from 1, 2, and 3, and A$_{31}$ may be selected from a carbazolyl group and a fluorenyl group, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_{31}$)($Q_{32}$)($Q_{33}$), —Si($Q_{31}$)($Q_{32}$)($Q_{33}$), —B($Q_{31}$)($Q_{32}$), —N($Q_{31}$)($Q_{32}$), —P($Q_{31}$)($Q_{32}$), —C(=O)($Q_1$), —S(=O)($Q_{31}$), —S(=O)$_2$($Q_{31}$), —P(=O)($Q_{31}$)($Q_{32}$), and —P(=S)($Q_{31}$)($Q_{32}$), wherein $Q_1$ to $Q_3$ and $Q_{31}$ to $Q_{33}$ may each independently be selected from hydrogen, deuterium, —F, —Cl, —Br, —I, $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, a biphenyl group, and a terphenyl group, and

* indicates a binding site to an adjacent atom.

According to one or more embodiments, an apparatus may include: a thin-film transistor including a source electrode, a drain electrode, and an active layer, and the organic light-emitting device, wherein the first electrode of the organic light-emitting device may be electrically connected to any one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 illustrates a schematic cross-sectional view of an embodiment of an organic light-emitting device.

FIG. 2 illustrates a schematic cross-sectional view of an embodiment of an organic light-emitting device.

FIG. 3 illustrates a schematic cross-sectional view of an embodiment of an organic light-emitting device.

FIG. 4 illustrates a schematic cross-sectional view of an embodiment of an organic light-emitting device.

DETAILED DESCRIPTION

Figure 5:
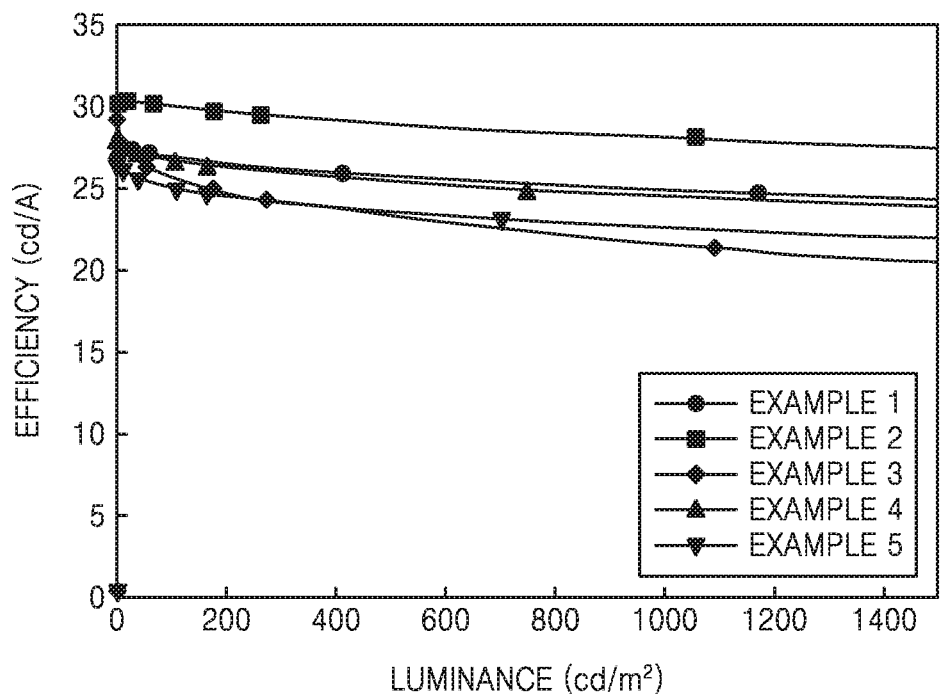
FIG. 5 is a graph of luminance (candela per square meter, $cd/m^2$) versus efficiency (candela per Ampere, cd/A) of organic light-emitting devices prepared in Examples 1 to 5.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical or electrical connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The term "organic layer" as used herein refers to a single layer and/or a plurality of layers between the first electrode and the second electrode in an organic light-emitting device. A material included in the "organic layer" is not limited to an organic material.

An organic light-emitting device may include a first electrode; a second electrode; and an organic layer between the first electrode and the second electrode, wherein the organic layer may include an emission layer, the emission layer may include a first compound, a second compound, and a third compound, the first compound may be represented by Formula 1, the second compound may be represented by Formula 2, the third compound may be represented by Formula 3, and the first compound, the second compound, and the third compound may be different from one another:

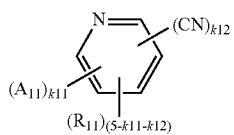

Formula 1

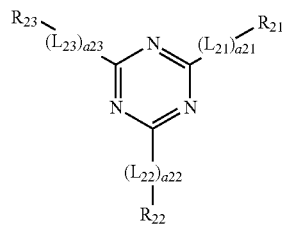

Formula 2

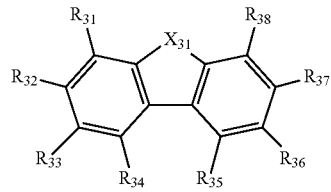

Formula 3 wherein in Formulae 1 to 3,
$A_{11}$ may be a group represented by Formula 10:

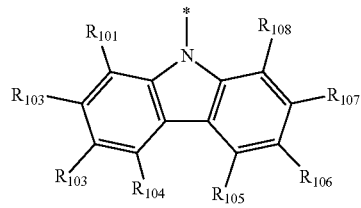

Formula 10 wherein, in Formula 10,
$R_{101}$ to $R_{108}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), k11 and k12 may each independently be selected from 1, 2, 3, and 4, $R_{11}$ may be selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Q_1)$, $-S(=O)_2(Q_1)$, $-P(=O)(Q_1)(Q_2)$, and $-P(=S)(Q_1)(Q_2)$, $L_{21}$ to $L_{23}$ may each independently be selected from a $C_5$-$C_{15}$ carbocyclic group and a heterocyclic group having 1 to 15 ring-forming atoms, each unsubstituted or substituted with at least one substituent selected from deuterium, $-F$, $-Cl$, $-Br$, $-I$, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_{31})(Q_{32})(Q_{33})$, $-Si(Q_{31})(Q_{32})(Q_{33})$, $-B(Q_{31})(Q_{32})$, $-N(Q_{31})(Q_{32})$, $-P(Q_{31})(Q_{32})$, $-C(=O)(Q_1)$, $-S(=O)(Q_{31})$, $-S(=O)_2(Q_{31})$, $-P(=O)(Q_{31})(Q_{32})$, and $-P(=S)(Q_{31})(Q_{32})$, a21 to a23 may each independently be selected from 0, 1, and 2, $R_{21}$ to $R_{23}$ may each independently be selected from a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, and a monovalent non-aromatic condensed heteropolycyclic group having 1 to 15 ring-forming atoms, each unsubstituted or substituted with at least one substituent selected from deuterium, $-F$, $-Cl$, $-Br$, $-I$, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_{31})(Q_{32})(Q_{33})$, $-Si(Q_{31})(Q_{32})(Q_{33})$, $-B(Q_{31})(Q_{32})$, $-N(Q_{31})(Q_{32})$, $-P(Q_{31})(Q_{32})$, $-C(=O)(Q_1)$, $-S(=O)(Q_{31})$, $-S(=O)_2(Q_{31})$, $-P(=O)(Q_{31})(Q_{32})$, and $-P(=S)(Q_{31})(Q_{32})$, and $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Q_1)$, $-S(=O)_2(Q_1)$, $-P(=O)(Q_1)(Q_2)$, and $-P(=S)(Q_1)(Q_2)$, $X_{31}$ may be selected from $N(R_{39})$, and $C(R_{39})(R_{40})$, $R_{31}$ to $R_{40}$ may each independently be selected from a group represented by $*$-$(L_{31})_{a31}$-$A_{31}$, hydrogen, deuterium, $-F$, $-Cl$, $-Br$, $-I$, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Q_1)$, $-S(=O)_2(Q_1)$, $-P(=O)(Q_1)(Q_2)$, and $-P(=S)(Q_1)(Q_2)$, provided that at least one selected from $R_{31}$ to $R_{39}$ may be a group represented by $*$-$(L_{31})_{a31}$-$A_{31}$, $L_{31}$ may be a phenylene group unsubstituted or substituted with at least one substituent selected from deuterium, $-F$, $-Cl$, $-Br$, $-I$, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_{31})(Q_{32})(Q_{33})$, $-Si(Q_{31})(Q_{32})(Q_{33})$, $-B(Q_{31})(Q_{32})$, $-N(Q_{31})(Q_{32})$, $-P(Q_{31})(Q_{32})$, $-C(=O)(Q_1)$, $-S(=O)(Q_{31})$, $-S(=O)_2(Q_{31})$, $-P(=O)(Q_{31})(Q_{32})$, and $-P(=S)(Q_{31})(Q_{32})$, a31 may be selected from 1, 2, and 3, and $A_{31}$ may be selected from a carbazolyl group and a fluorenyl group, each unsubstituted or substituted with at least one substituent selected from deuterium, $-F$, $-Cl$, $-Br$, $-I$, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, $-C(Q_{31})(Q_{32})(Q_{33})$, $-Si(Q_{31})(Q_{32})(Q_{33})$, $-B(Q_{31})(Q_{32})$, $-N(Q_{31})(Q_{32})$, $-P(Q_{31})(Q_{32})$, $-C(=O)(Q_1)$, $-S(=O)(Q_{31})$, $-S(=O)_2(Q_{31})$, $-P(=O)(Q_{31})(Q_{32})$, and $-P(=S)(Q_{31})(Q_{32})$;

wherein $Q_1$ to $Q_3$ and $Q_{31}$ to $Q_{33}$ may each independently be selected from hydrogen, deuterium, $-F$, $-Cl$, $-Br$, $-I$, $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, a biphenyl group, and a terphenyl group, and

* indicates a binding site to an adjacent atom.

In some embodiments, in Formula 1, k11 and k12 may each independently be selected from 1 and 2.

In some embodiments, in Formula 1, the sum of k11 and k12 may be selected from 3 and 4.

In one or more embodiments, the first compound may be represented by any one of Formulae 1-1 to 1-58:

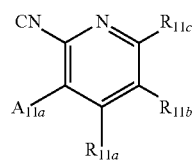
1-1

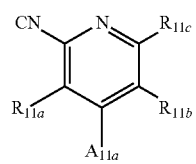
1-2

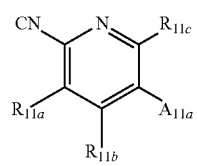
1-3

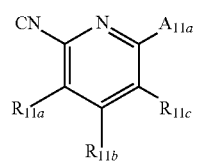
1-4

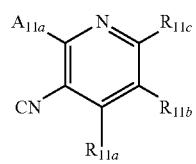
1-5

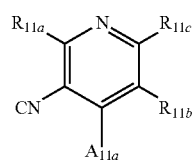
1-6

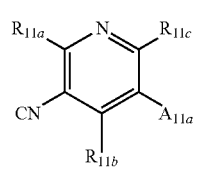
1-7

-continued

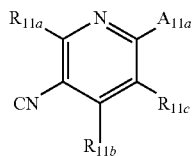
1-8

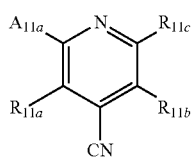
1-9

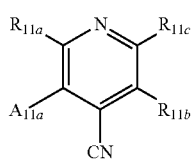
1-10

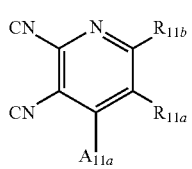
1-11

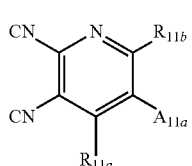
1-12

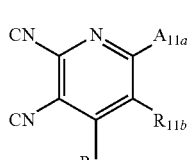
1-13

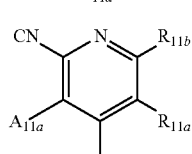
1-14

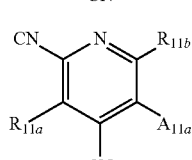
1-15

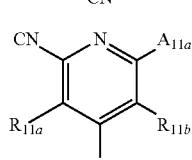
1-16

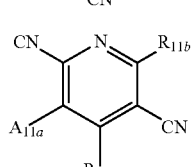
1-17

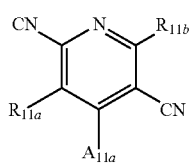 1-18
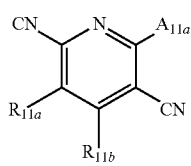 1-19
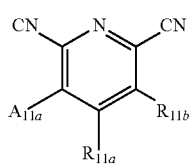 1-20
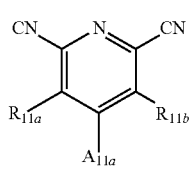 1-21
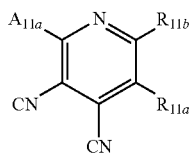 1-22
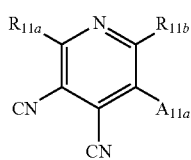 1-23
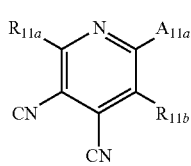 1-24
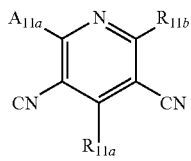 1-25
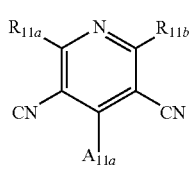 1-26
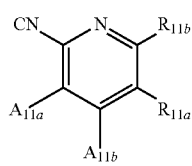 1-27
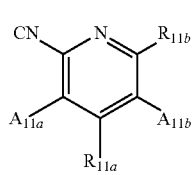 1-28
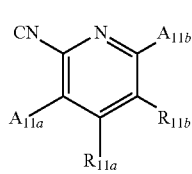 1-29
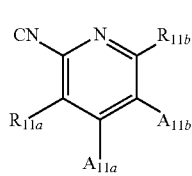 1-30
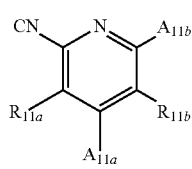 1-31
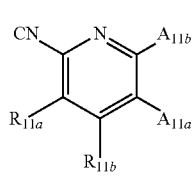 1-32
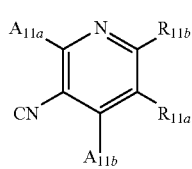 1-33
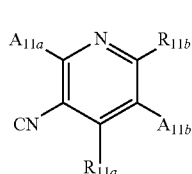 1-34
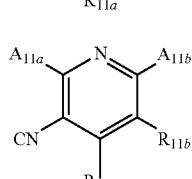 1-35

-continued
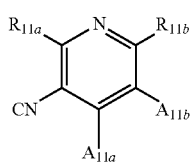
1-36
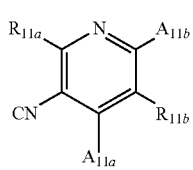
1-37
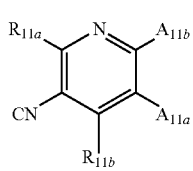
1-38
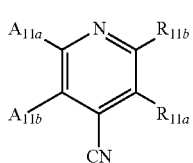
1-39
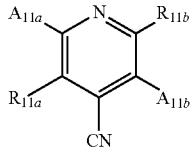
1-40
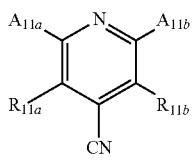
1-41
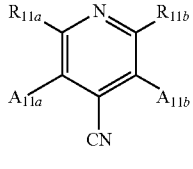
1-42
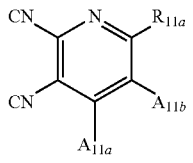
1-43
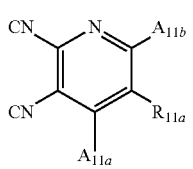
1-44
-continued
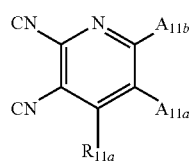
1-45
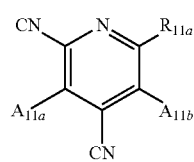
1-46
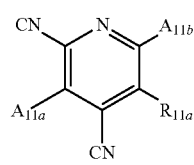
1-47
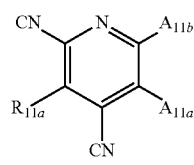
1-48
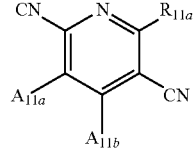
1-49
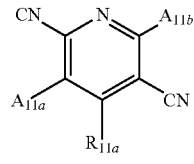
1-50
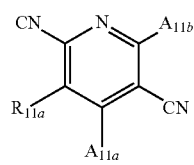
1-51
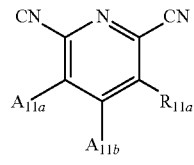
1-52
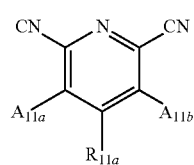
1-53

-continued

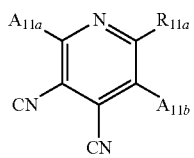
1-54

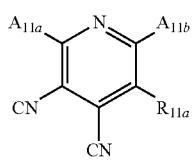
1-55

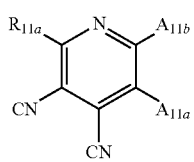
1-56

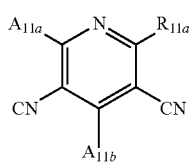
1-57

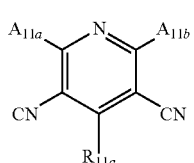
1-58 wherein, in Formulae 1-1 to 1-58, $A_{11a}$, $R_{11b}$, and $R_{11c}$ may each be understood by referring to the description of $R_{11}$ in Formula 1, and $R_{11a}$, $R_{11b}$, and $R_{11c}$ may each be understood by referring to the description of $R_{11}$ in Formula 1.

In some embodiments, in Formula 1, $A_{11}$ may be represented by any one of Formulae 10-1 and 10-2:

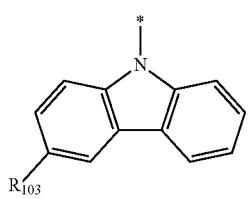
10-1

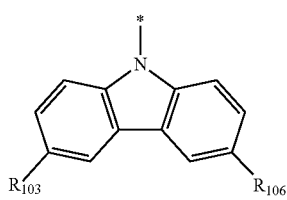
10-2 wherein, in Formulae 10-1 and 10-2,

R103 and R106 may each independently be selected from deuterium, —F, —Cl, —Br, —I, a hydroxyl group, a cyano group, a nitro group, an amidino group, a hydrazino group, a hydrazono group, a C1-C10 alkyl group, a C2-C10 alkenyl group, a C2-C10 alkynyl group, a C1-C10 alkoxy group, a C3-C10 cycloalkyl group, a heterocycloalkyl group having 1 to 10 ring-forming atoms, a C3-C15 cycloalkenyl group, a heterocycloalkenyl group having 1 to 15 ring-forming atoms, a C6-C15 aryl group, a C6-C15 aryloxy group, a C6-C15 arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein Q1 to Q3 may each independently be selected from hydrogen, deuterium, —F, —Cl, —Br, —I, C1-C10 alkyl group, a C2-C10 alkenyl group, a C2-C10 alkynyl group, a C1-C10 alkoxy group, a C3-C10 cycloalkyl group, a heterocycloalkyl group having 1 to 10 ring-forming atoms, a C3-C15 cycloalkenyl group, a heterocycloalkenyl group having 1 to 15 ring-forming atoms, a C6-C15 aryl group, a C6-C15 aryloxy group, a C6-C15 arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, a biphenyl group, and a terphenyl group, and

* indicates a binding site to an adjacent atom.

In some embodiments, in Formulae 10, 10-1, and 10-2, R103 and R106 may each independently be selected from —F, a cyano group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In some embodiments, in Formula 1, R11 may be selected from hydrogen, deuterium, —F, —Cl, —Br, —I, a hydroxyl group, a cyano group, a nitro group, an amidino group, a hydrazino group, a hydrazono group, a C1-C10 alkyl group, a C3-C15 cycloalkenyl group, a heterocycloalkenyl group having 1 to 15 ring-forming atoms, a C6-C15 aryl group, a heteroaryl group having 1 to 15 ring-forming atoms, a monovalent non-aromatic condensed polycyclic group having 1 to 15 ring-forming atoms, and a monovalent non-aromatic condensed heteropolycyclic group having 1 to 15 ring-forming atoms.

In some embodiments, in Formula 1, R11 may be hydrogen.

In some embodiments, in Formula 2, L21 to L23 may each independently be selected from a benzene group, a naphthalene group, a phenalene group, an anthracene group, a phenanthrene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a quinazoline group, a benzoquinoxaline group, a benzoquinazoline group, a fluorene group, a carbazole group, a dibenzofuran group, a dibenzothiophene group, an azafluorene group, an azacarbazole group, an azadibenzofuran group, an azadibenzothiophene group, a diazafluorene group, a diazacarbazole group, a diazadibenzofuran group, and a diazadibenzothiophene group, each unsubstituted or substituted with at least one substituent selected from deuterium, —F, —Cl, —Br, —I, a hydroxyl group, a cyano group, a nitro group, an amidino group, a hydrazino group, a hydrazono group, a C1-C10 alkyl group, a C1-C10 alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In some embodiments, in Formula 2, a21 to a23 may each independently be selected from 0 and 1.

In Formula 2, when a21 to a23 are each 0, (L21)a21, (L22)a22, and (L23)a23 may be a single bond.

In some embodiments, in Formula 2, R21 to R23 may each independently be selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each unsubstituted or substituted with at least one substituent selected from deuterium, —F, —Cl, —Br, —I, a hydroxyl group, a cyano group, a nitro group, an amidino group, a hydrazino group, a hydrazono group, a C1-C10 alkyl group, a C1-C10 alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, —C(Q31)(Q32)(Q33), —Si(Q31)(Q32)(Q33), —B(Q31)(Q32), —N(Q31)(Q32), —P(Q31)(Q32), —C(=O)(Q1), —S(=O)(Q31), —S(=O)$_2$(Q31), —P(=O)(Q31)(Q32), and —P(=S)(Q31)(Q32); and
—C(Q1)(Q2)(Q3), —Si(Q1)(Q2)(Q3), —B(Q1)(Q2), —N(Q1)(Q2), —P(Q1)(Q2), —C(=O)(Q1), —S(=O)(Q1), —S(=O)$_2$(Q1), —P(=O)(Q1)(Q2), and —P(=S)(Q1)(Q2), wherein Q1 to Q3 and Q31 to Q33 may each independently be selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In some embodiments, in Formula 2, R21 to R23 may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, each unsubstituted or substituted with at least one substituent selected from deuterium, a C1-C10 alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C(Q$_{31}$)(Q$_{32}$)(Q$_{33}$), and —Si(Q$_{31}$)(Q$_{32}$)(Q$_{33}$); and
—C(Q$_1$)(Q$_2$)(Q$_3$) and —Si(Q$_1$)(Q$_2$)(Q$_3$), wherein Q$_1$ to Q$_3$ and Q$_{31}$ to Q$_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group.

In some embodiments, in Formula 2, at least one selected from R$_{21}$ to R$_{23}$ may be selected from a group represented by Formula 7-1, a group represented by Formula 7-2, —C(Q$_1$)(Q$_2$)(Q$_3$), and —Si(Q$_1$)(Q$_2$)(Q$_3$), but embodiments are not limited thereto:

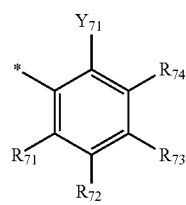

Formula 7-1

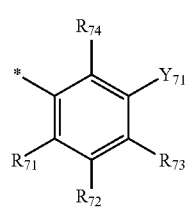

Formula 7-2 wherein, in Formulae 7-1 and 7-2,
Y$_{71}$ may be selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C(Q$_{31}$)(Q$_{32}$)(Q$_{33}$), and —Si(Q$_{31}$)(Q$_{32}$)(Q$_{33}$), R$_{71}$ to R$_{74}$ may each independently be selected from hydrogen, deuterium, a C$_1$-C$_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —C(Q$_{31}$)(Q$_{32}$)(Q$_{33}$), and —Si(Q$_{31}$)(Q$_{32}$)(Q$_{33}$), Q$_1$ to Q$_3$ and Q$_{31}$ to Q$_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to an adjacent atom.

In some embodiments, in Formula 3, X$_{31}$ may be N(R$_{39}$).

In some embodiments, in Formula 3, R$_{31}$ to R$_{40}$ may each independently be selected from a group represented by *-(L$_3$ hydrogen, deuterium, —F, —Cl, —Br, —I, a hydroxyl group, a cyano group, a nitro group, an amidino group, a hydrazino group, a hydrazono group, a C$_1$-C$_{10}$ alkyl group, a C$_1$-C$_{10}$ alkoxy group, a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, provided that at least one selected from R$_{31}$ to R$_{39}$ may be the group represented by *-(L$_{31}$)$_{a31}$-A$_{31}$.

In some embodiments, in Formula 3, L$_{31}$ may be a phenylene group unsubstituted or substituted with at least one substituent selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group.

In some embodiments, in Formula 3, a31 may be selected from 1 and 2.

In some embodiments, in Formula 3, A$_{31}$ may be a carbazolyl group unsubstituted or substituted with at least one substituent selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group.

In some embodiments, in Formula 3, A$_{31}$ may be represented by any one of Formulae 8-1 to 8-5:

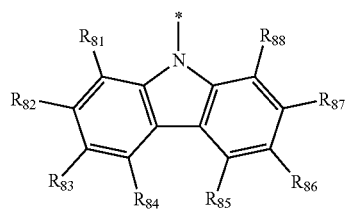

8-1

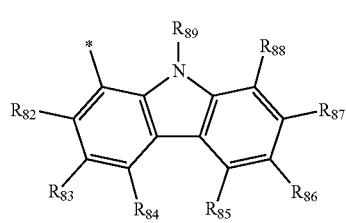

8-2

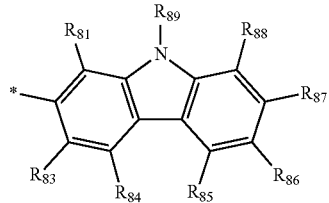

8-3

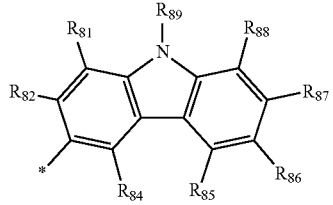

8-4

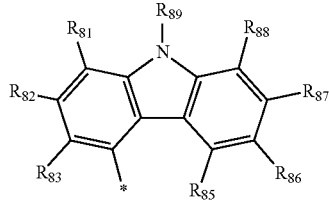

8-5 wherein, in Formulae 8-1 to 8-5,

R$_{81}$ to R$_{89}$ may each independently be selected from hydrogen, a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to an adjacent atom.

In one or more embodiments, the third compound may be represented by any one of Formulae 3-1 to 3-5:

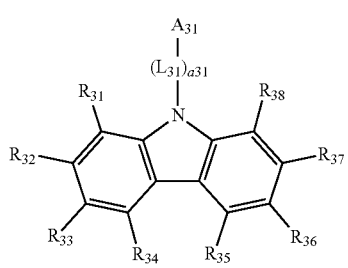

3-1

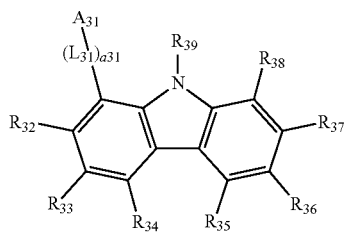

3-2

3-3

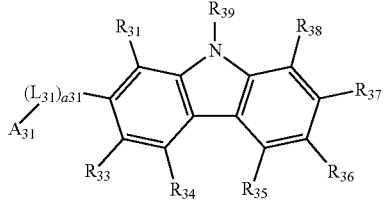

3-4

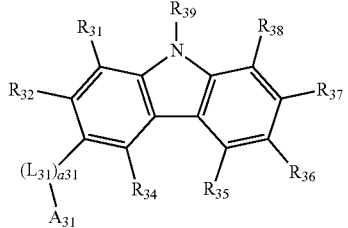

3-5

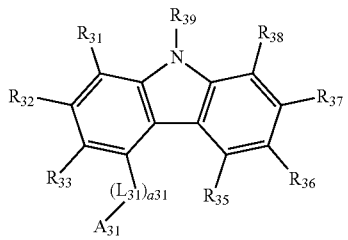

wherein, in Formulae 3-1 to 3-5, $L_{31}$, a31, $A_{31}$, and $R_{31}$ to $R_{39}$ may respectively be understood by referring to the descriptions of $L_{31}$, a31, $A_{31}$, and $R_{31}$ to $R_{39}$ in Formula 3.

In some embodiments, in Formulae 3-1 to 3-5, $A_{31}$ may be represented by any one of Formulae 8-1 to 8-5:

8-1

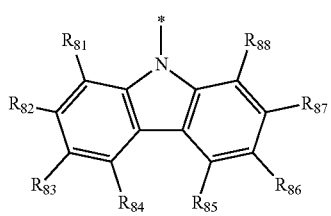

8-2

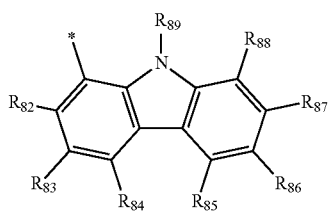

8-3

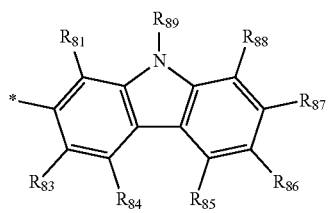

8-4

8-5 wherein, in Formulae 8-1 to 8-5, $R_{81}$ to $R_{89}$ may each independently be selected from hydrogen, a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to an adjacent atom.

In some embodiments the first compound may be selected from Group I:

Group I

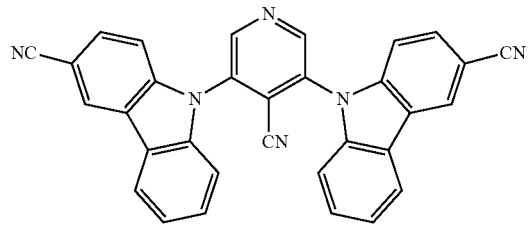

TBD-01

TBD-02

TBD-03

TBD-04
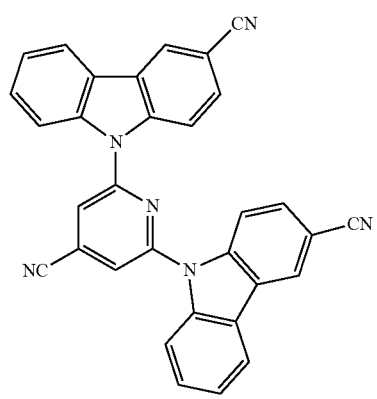
TBD-05
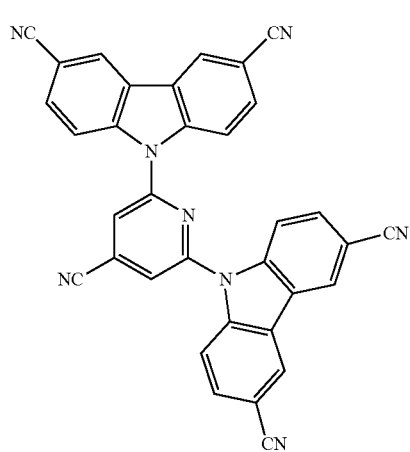
TBD-06
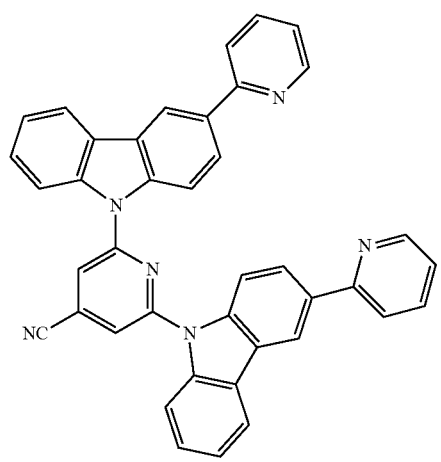
TBD-07
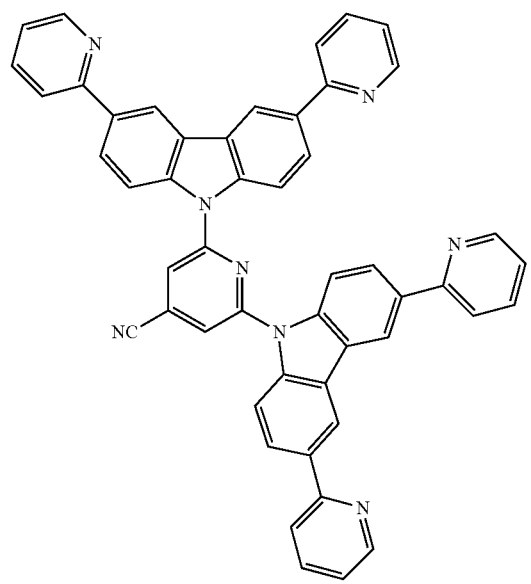
TBD-08
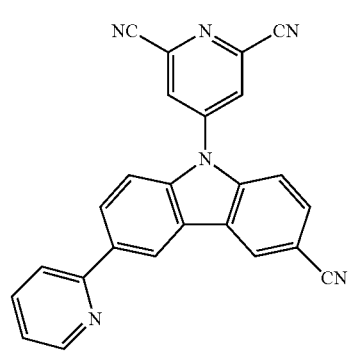
TBD-09
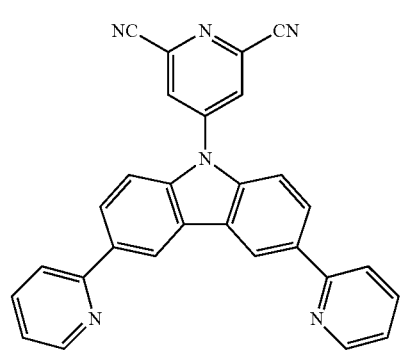
TBD-10
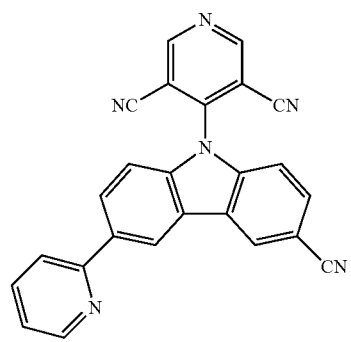

TBD-11
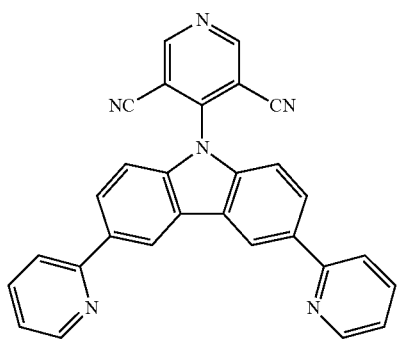
TBD-14
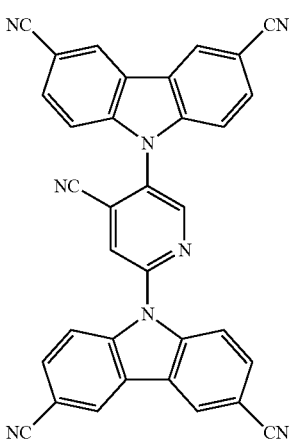
TBD-12
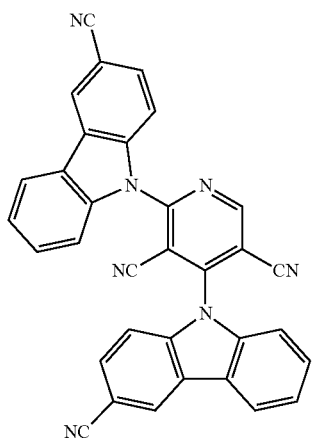
TBD-15
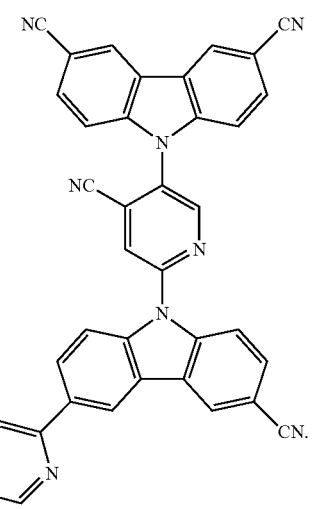
TBD-13
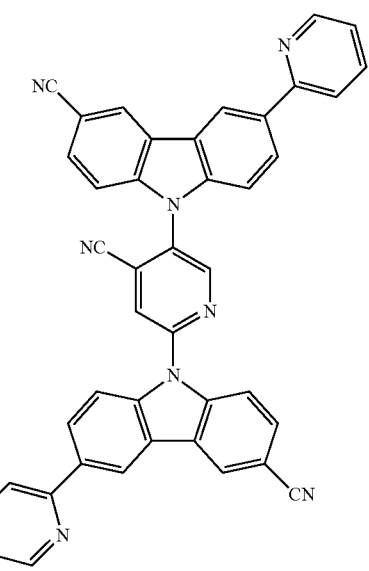
In some embodiments the second compound may be selected from Group II:
Group II
ET01
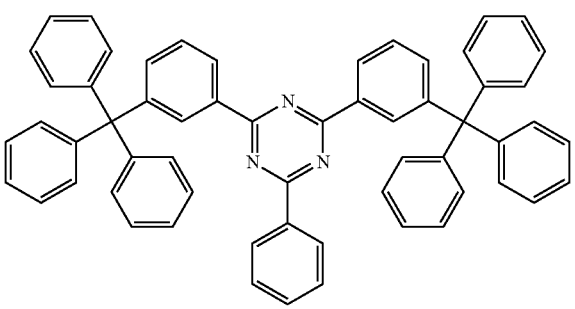

ET02
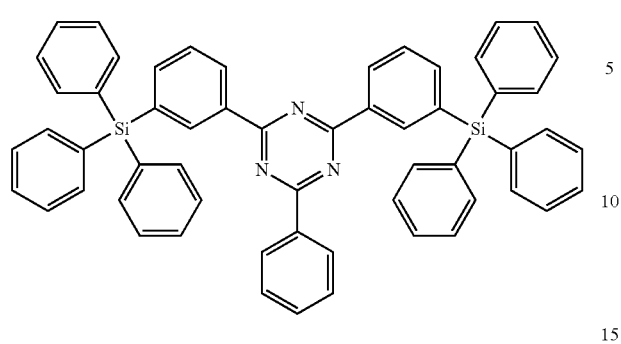
ET03
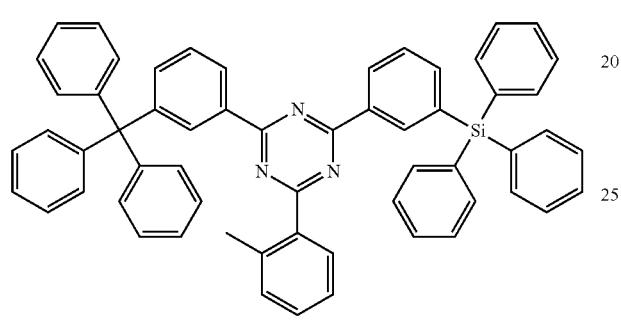
ET04
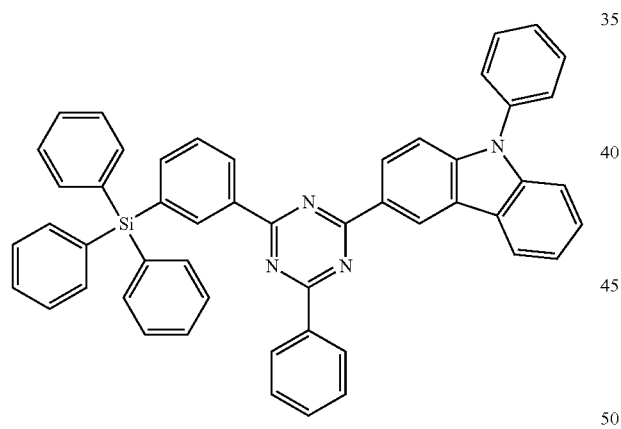
ET05
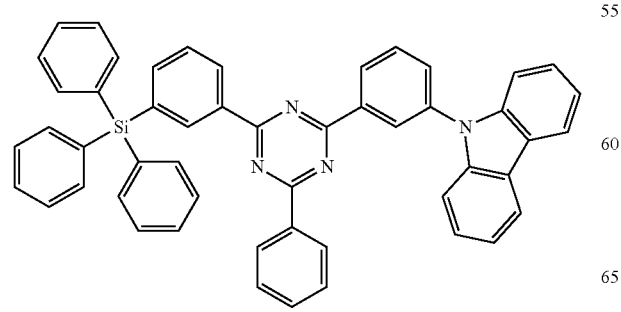
ET06
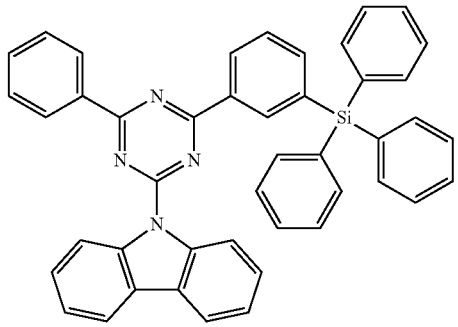
ET07
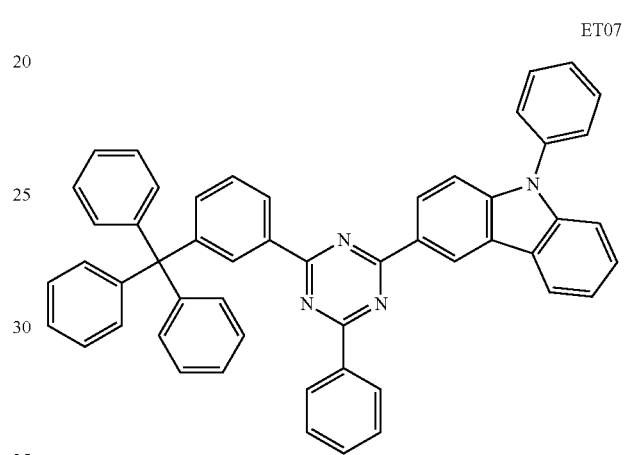
ET08
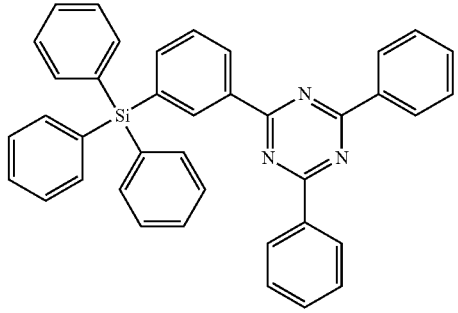
ET09
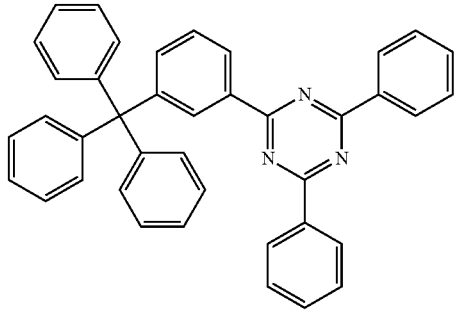

ET010
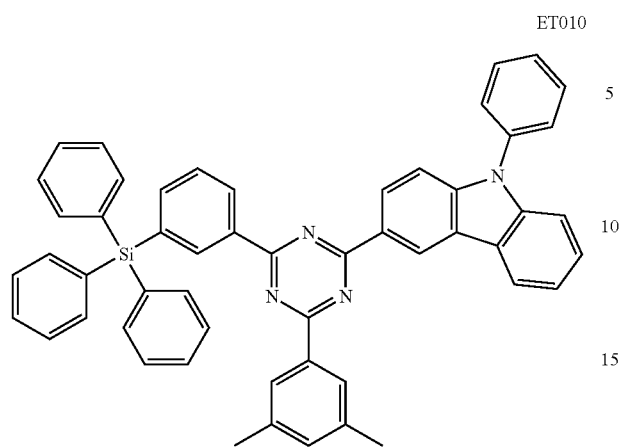
ET011
ET014
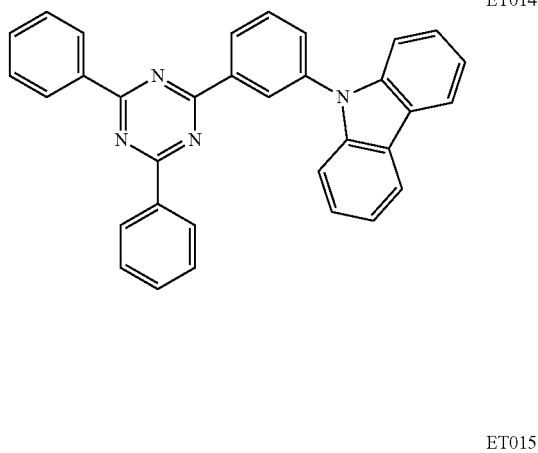
ET015
ET012
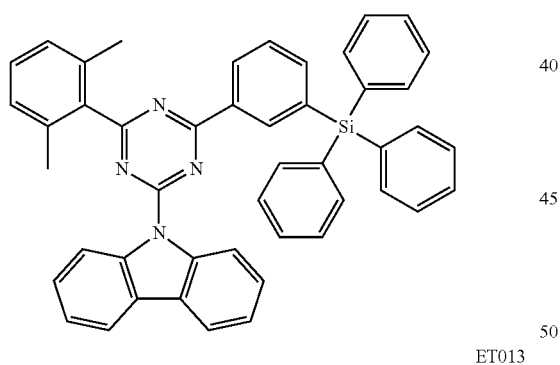
In some embodiments the third compound may be selected from Group III:
Group III
HT-01
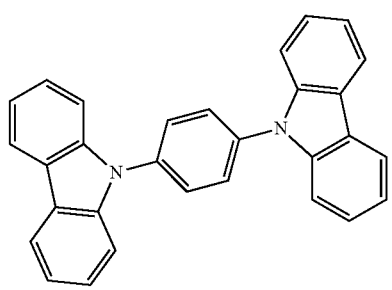
ET013
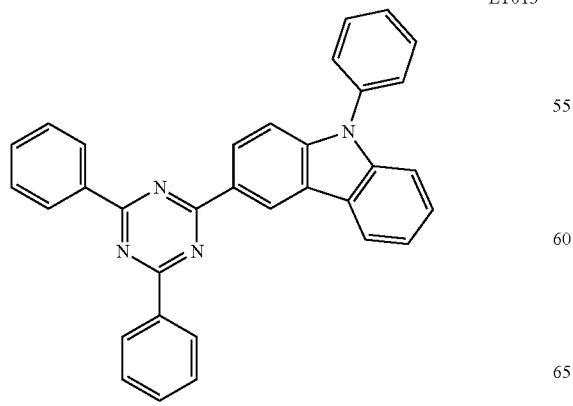
HT-02
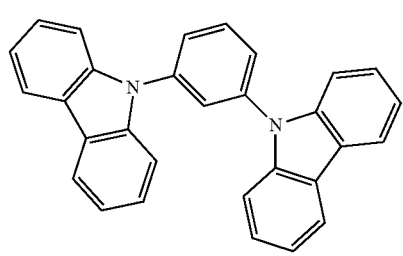

HT-03
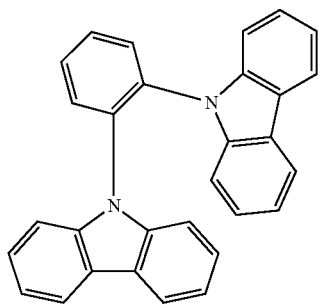

HT-04
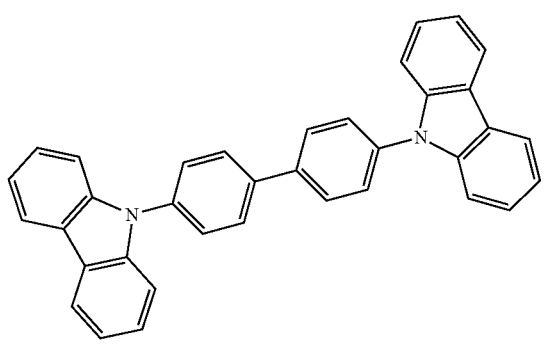

HT-05
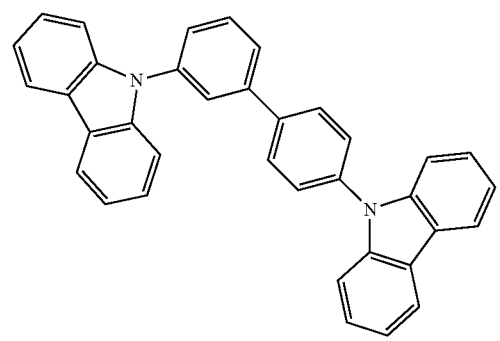

HT-06
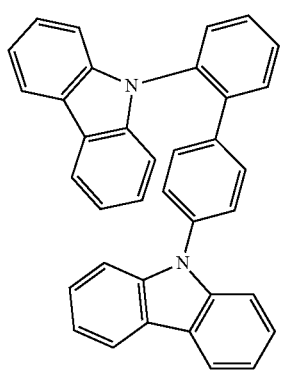

HT-07
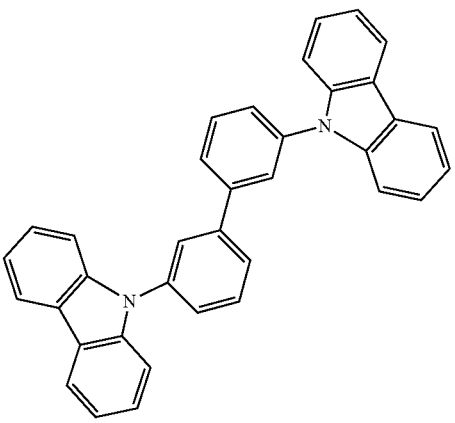

HT-08
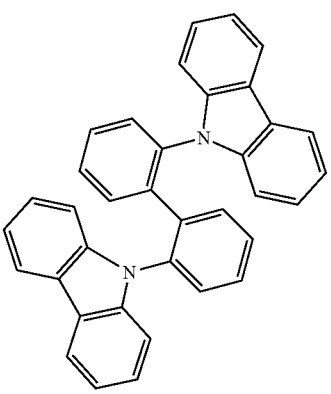

HT-09
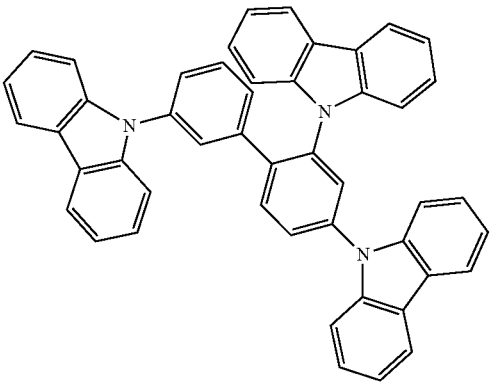

The first compound may be a delayed fluorescence emitter. The first compound may be a thermally activated delayed fluorescence (TADF) emitter.

The first compound may have a maximum emission wavelength in a range of about 450 nanometers (nm) to about 550 nm, but embodiments are not limited thereto.

However, the first compound in the emission layer may not participate in forming excitons but emit blue delayed fluorescence by receiving energy from the formed excitons.

The first compound may satisfy the following Condition 1:

$$\Delta E_{ST}(C1) \leq 0.3 \text{ eV} \qquad \text{Condition 1}$$

wherein, in Condition 1, $\Delta E_{ST}(C1)$ indicates a difference between a lowest excited singlet energy level ($E_{S1}(C1)$) and a lowest excited triplet energy level ($E_{T1}(C1)$) of the first compound.

Here, $E_{S1}(C1)$ and $E_{T1}(C1)$ may be evaluated by using Gaussian according to density functional theory (DFT) method (wherein structure optimization is performed at a degree of B3LYP, and 6-31G(d,p)).

When Condition 1 is satisfied, a sufficient level of reverse intersystem crossing (RISC) efficiency may be achieved.

The organic light-emitting device may have an energy level that may allow emission of fluorescence from the first compound, thereby providing an organic light-emitting device having a high colorimetric purity.

In addition, since the first compound includes a relatively strong donor and a relatively strong acceptor, the highest occupied molecular orbital (HOMO) and lowest unoccupied molecular orbital (LUMO) in Formula 1 may be relatively easily separated. As a result, a degree of separation of HOMO and LUMO may be enhanced, and the spin orbit coupling (SOC) is increased, thereby improving the RISC speed. Accordingly, when an organic light-emitting device includes the first compound, the organic light-emitting device may have improved efficiency and/or lifespan.

In general, when electrons are not injected smoothly from an electron transport region into an emission layer, charges may be accumulated at an interface between the emission layer and the electron transport region, and deterioration of the interface may be caused. On the other hand, when holes are not injected smoothly from a hole transport region into the emission layer, charges may be accumulated at an interface between the emission layer and the hole transport region, and deterioration of the interface may be caused. Accordingly, degradation of the lifespan of the organic light-emitting device may be caused.

Since the second compound necessarily includes an electron transporting moiety, the second compound may be easily used to control the electron transportability of the organic light-emitting device, and since the third compound may not include an electron transporting moiety, the third compound may be easily used to control the hole transportability of the organic light-emitting device. Accordingly, charge balance in an emission layer in the organic light-emitting device may be optimized.

In particular, when the second compound and the third compound have an energy level sufficient to form an exciplex and have intermolecular interactions with each other, the second compound and the third compound may stably transfer energy to the first compound. Accordingly, efficiency of an organic light-emitting device including the first, second, and third compounds may be improved.

Since the second compound may essentially include substituents having large steric hindrance, such as Formulae 7-1 and 7-2, $-C(Q_1)(Q_2)(Q_3)$, and $-Si(Q_1)(Q_2)(Q_3)$, the lowest excited triplet energy level of the second compound may be relatively high.

Also, in the third compound, since a31 may be selected from 1, 2, and 3, the lowest excited triplet energy level of the third compound may be relatively high.

The organic light-emitting device may emit delayed fluorescence in a range of about 450 nm to about 550 nm, but embodiments are not limited thereto.

The amount of the second compound in the emission layer may be in a range of about 10 percent by weight (wt %) to about 90 wt %, but embodiments are not limited thereto.

The amount of the third compound in the emission layer may be in a range of about 10 wt % to about 90 wt %, but embodiments are not limited thereto.

The amount of the first compound in the emission layer may be in a range of about 0.5 wt % to about 5 wt %, but embodiments are not limited thereto.

The amount of the first compound may be in a range of about 0.01 parts to 30 parts by weight based on the total amount of 100 parts by weight of the second compound and the third compound, but embodiments are not limited thereto.

When the amount of each of the first compound, the second compound, and the third compound is within these ranges, an organic light-emitting device including the first compound, the second compound, and the third compound may have improved efficiency, lifespan, and roll-off.

In some embodiments, the emission layer may consist of the first compound, the second compound, and the third compound, but embodiments are not limited thereto.

In some embodiments, the emission layer may include a thermally activated delayed fluorescent (TADF) dopant represented by Formula 1, an electron transport (ET) host represented by Formula 2, and a hole transport (HT) host represented by Formula 3.

In some embodiments, the first electrode may be an anode, the second electrode may be a cathode, and the organic layer may further include a hole transport region between the first electrode and the emission layer and/or an electron transport region between the emission layer and the second electrode, wherein the hole transport region may include a hole injection layer, a hole transport layer, an emission auxiliary layer, an electron blocking layer, or a combination thereof, and the electron transport region may include a hole blocking layer, an electron transport layer, an electron injection layer, or a combination thereof, but embodiments are not limited thereto.

Description of FIG. 1

Figures 1, 2:
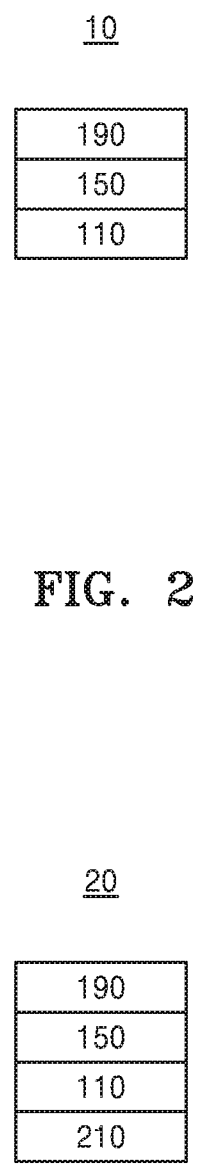

FIG. 1 is a schematic view of an organic light-emitting device 10 according to an exemplary embodiment. The organic light-emitting device 10 may include a first electrode 110, an organic layer 150, and a second electrode 190.

Hereinafter, the structure of the organic light-emitting device 10 according to an embodiment and a method of manufacturing an organic light-emitting device according to an embodiment will be described in connection with FIG. 1.

First Electrode 110

In FIG. 1, a substrate may be additionally located under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering, onto the substrate, a material for forming the first electrode 110. When the first electrode 110 is an anode, the material for forming the first electrode 110 may be selected from materials with a high work function that facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but embodiments are not limited thereto. In some embodiments, when the first electrode 110 is a semi-transmissive electrode or a reflective electrode, as a material for forming the first electrode 110, at least one of magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The first electrode 110 may have a single-layered structure, or a multi-layered structure including two or more layers. In some embodiments, the first electrode 110 may have a triple-layered structure of ITO/Ag/ITO, but embodiments are not limited thereto.

Organic Layer 150

The organic layer 150 may be on the first electrode 110. The organic layer 150 may include an emission layer.

The organic layer 150 may further include a hole transport region between the first electrode 110 and the emission layer and an electron transport region between the emission layer and the second electrode 190.

Hole Transport Region in Organic Layer 150

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include at least one selected from a hole injection layer, a hole transport layer, an emission auxiliary layer, and an electron blocking layer.

For example, the hole transport region may have a single-layered structure including a single layer including a plurality of different materials or a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order, but embodiments are not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

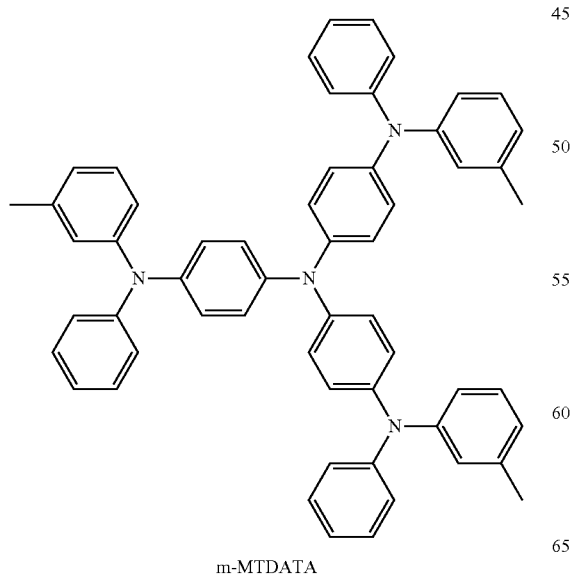

m-MTDATA

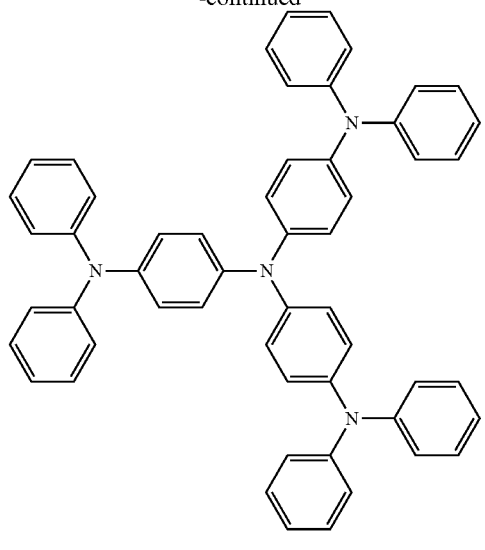

TDATA

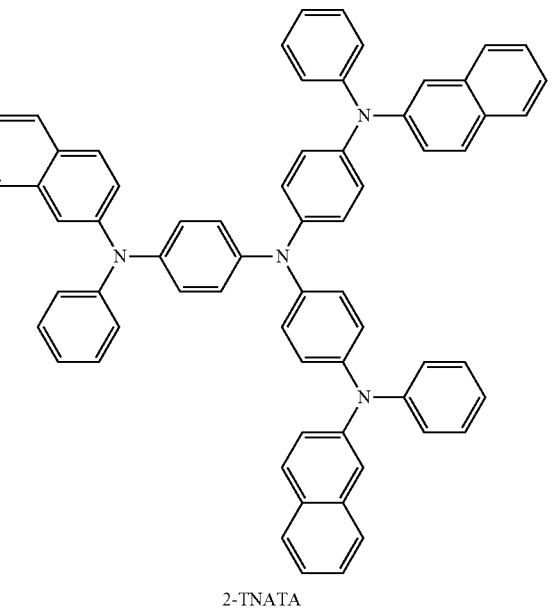

2-TNATA

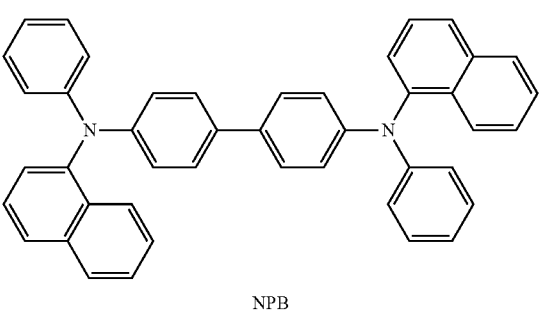

NPB

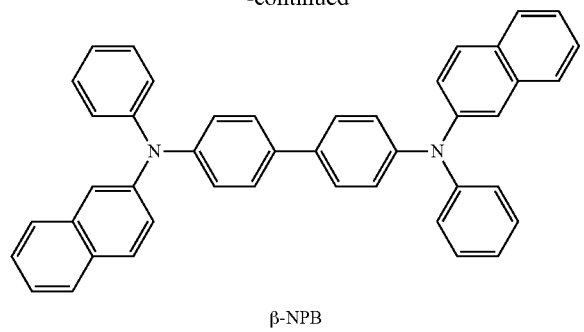

β-NPB

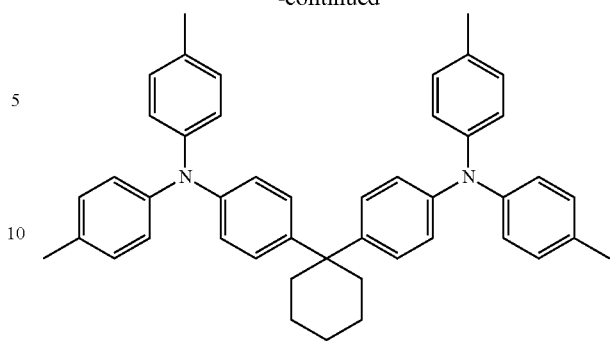

TAPC

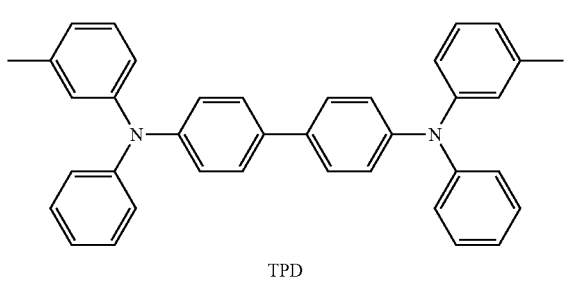

TPD

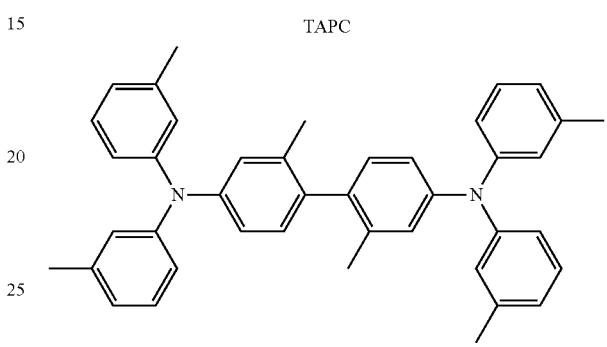

HMTPD

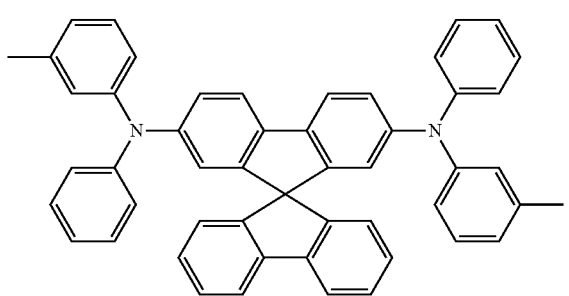

Spiro-TPD

Formula 201

$$R_{201}-(L_{201})_{xa1}-N\begin{matrix}(L_{202})_{xa2}-R_{202}\\(L_{203})_{xa3}-R_{203}\end{matrix}$$

Formula 202

$$\begin{matrix}R_{201}-(L_{201})_{xa1}\\R_{202}-(L_{202})_{xa2}\end{matrix}N-(L_{205})_{xa5}-N\begin{matrix}(L_{203})_{xa3}-R_{203}\\(L_{204})_{xa4}-R_{204}\end{matrix}$$

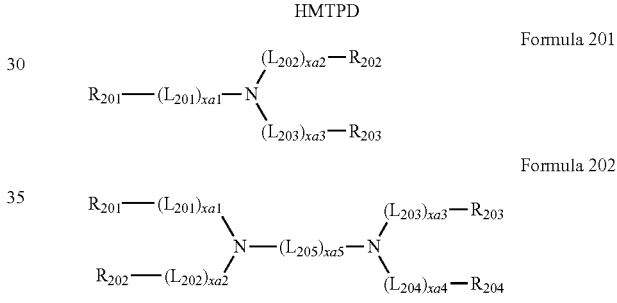

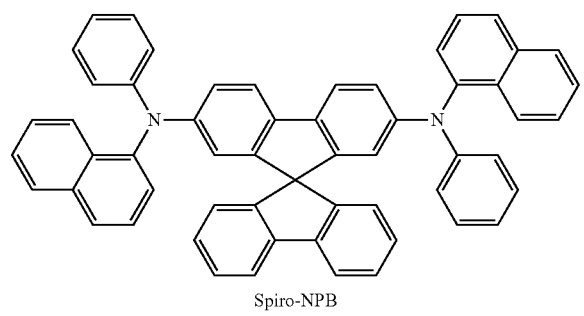

Spiro-NPB

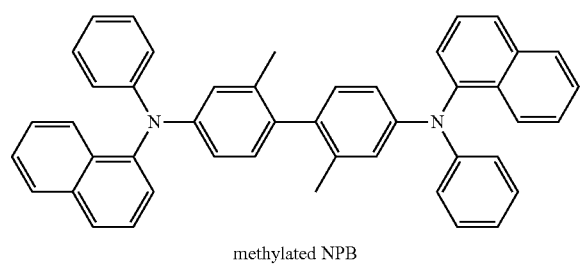

methylated NPB wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formula 201 and 202, $L_{201}$ to $L_{205}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si$(Q_{31})(Q_{32})(Q_{33})$, and —N$(Q_{31})(Q_{32})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In some embodiments, xa1 to xa4 may each independently be 0, 1, or 2.

In some embodiments, xa5 may be 1, 2, 3, or 4.

In some embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, $-Si(Q_{31})(Q_{32})(Q_{33})$, and $-N(Q_{31})(Q_{32})$, wherein $Q_{31}$ to $Q_{33}$ may respectively be understood by referring to the descriptions of $Q_{31}$ to $Q_{33}$ provided herein.

In some embodiments, in Formula 201, at least one selected from $R_{201}$ to $R_{203}$ may each independently be selected from a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In some embodiments, in Formula 202, i) $R_{201}$ and $R_{202}$ may be bound via a single bond, and/or ii) $R_{203}$ and $R_{204}$ may be bound via a single bond.

In some embodiments, in Formula 202, at least one selected from $R_{201}$ to $R_{204}$ may be selected from a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

Formula 201A

In some embodiments, the compound represented by Formula 201 may be represented by Formula 201A(1), but embodiments are not limited thereto:

Formula 201A(1)

In some embodiments, the compound represented by Formula 201 may be represented by Formula 201A-1, but embodiments are not limited thereto:

Formula 201A-1

In some embodiments, the compound represented by Formula 202 may be represented by Formula 202A:

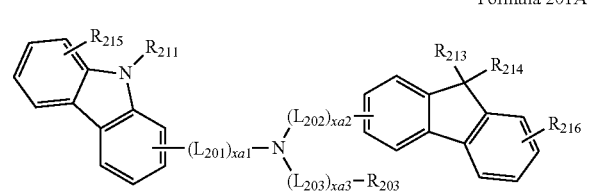

Formula 202A

In some embodiments, the compound represented by Formula 202 may be represented by Formula 202A-1:

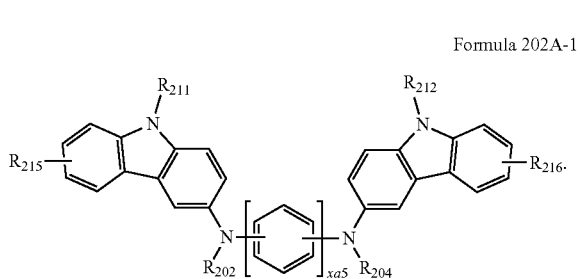

Formula 202A-1

In Formulae 201A, 201A(1), 201A-1, 202A, and 202A-1, $L_{201}$ to $L_{203}$, xa1 to xa3, xa5, and $R_{202}$ to $R_{204}$ may respectively be understood by referring to the description of $L_{201}$ to $L_{203}$, xa1 to xa3, xa5, and $R_{202}$ to $R_{204}$ provided herein, $R_{211}$ and $R_{212}$ may each be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments are not limited thereto:

HT1

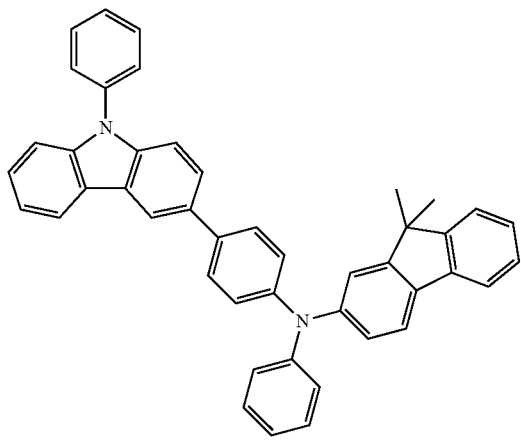

HT2

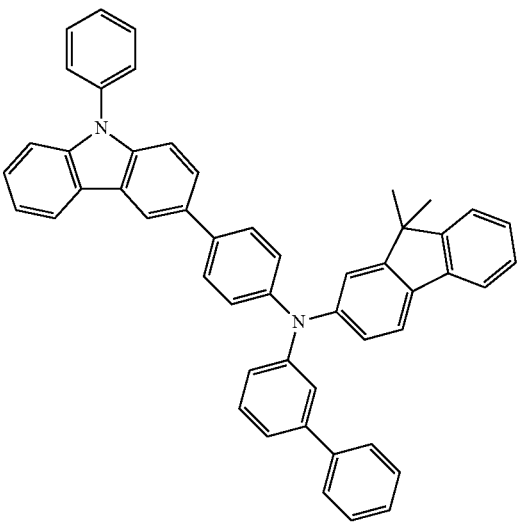

HT3

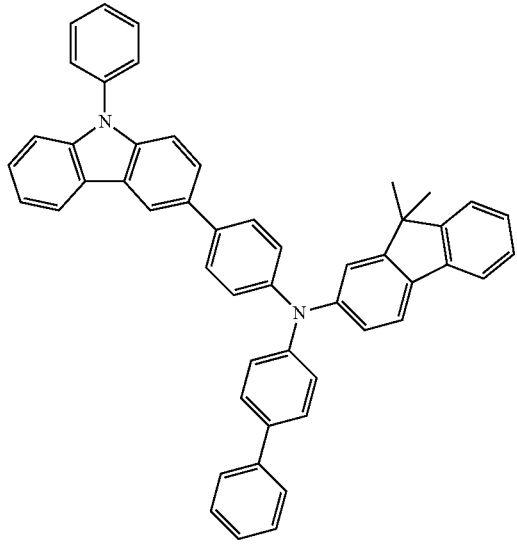

HT4

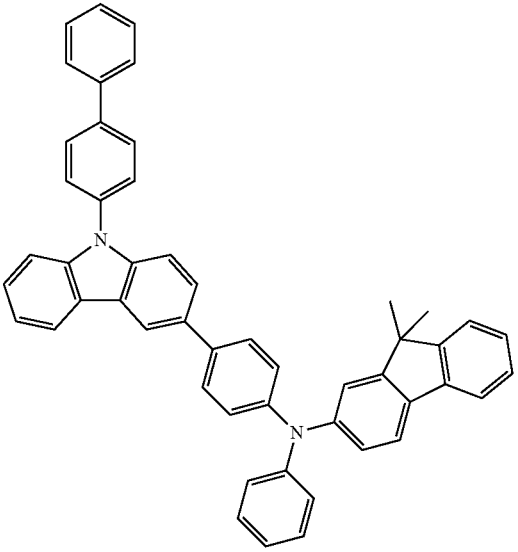

HT5
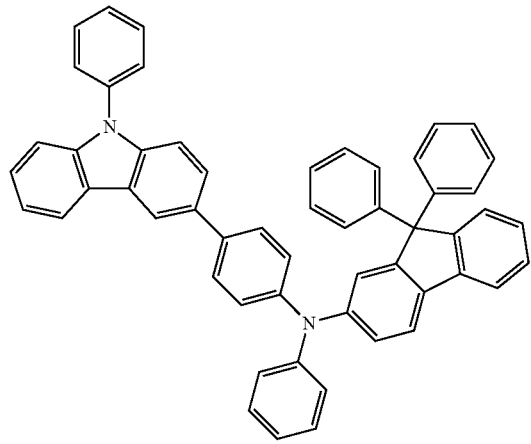
HT6
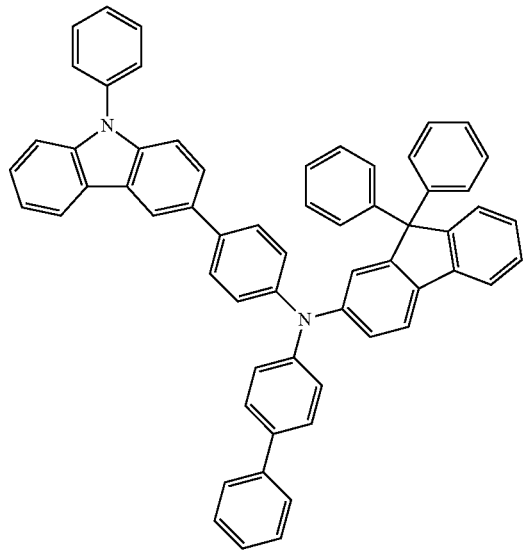
HT7
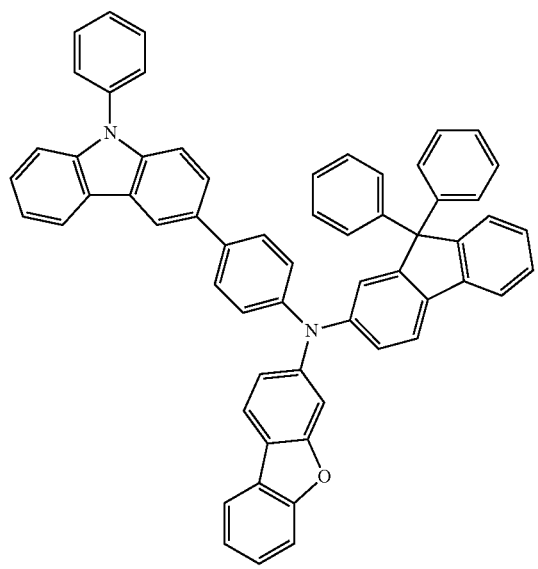
HT8
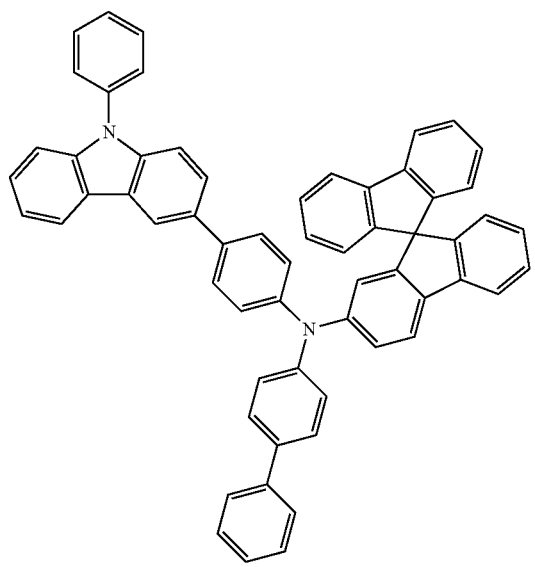

-continued
HT9
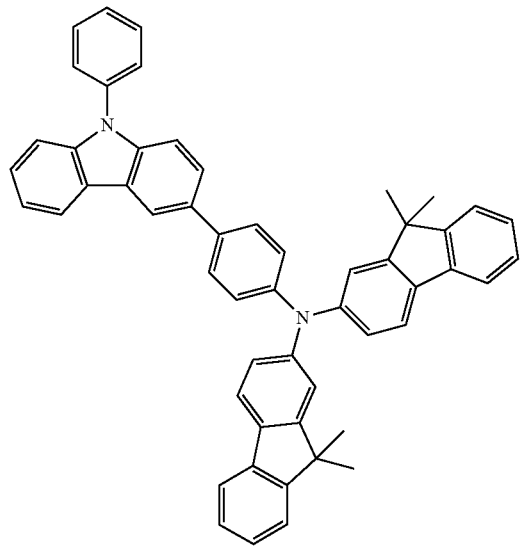
HT10
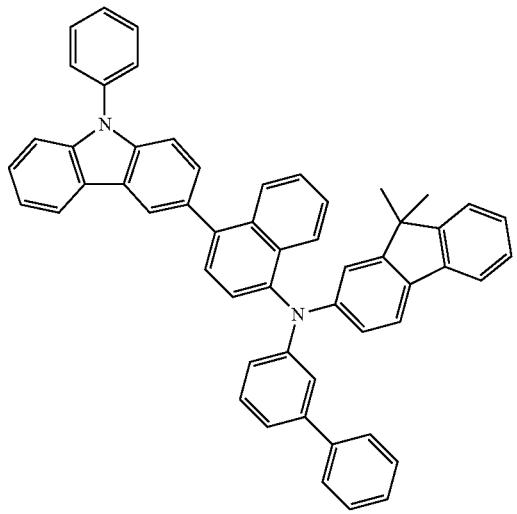
HT11
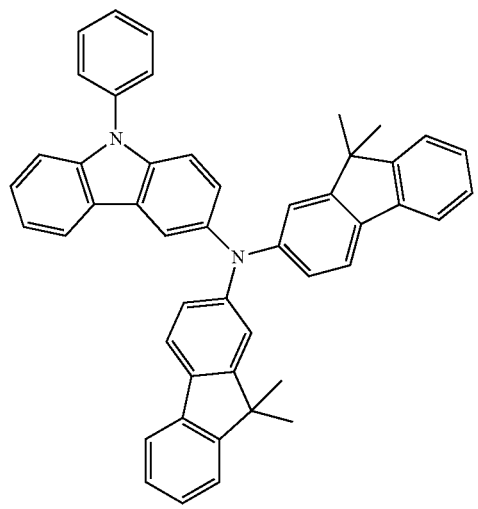
HT12
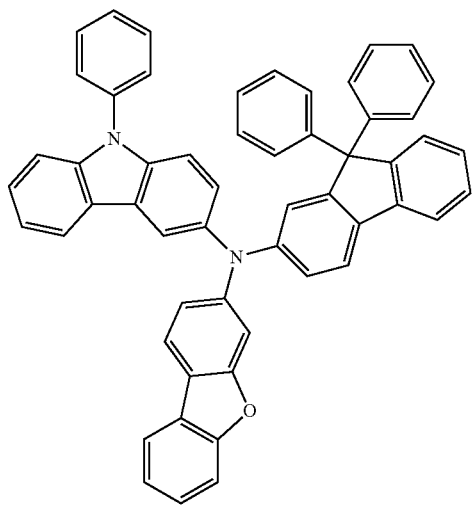
HT13
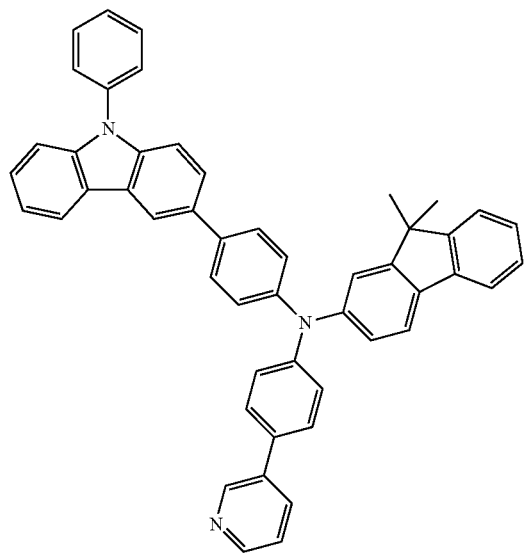
HT14
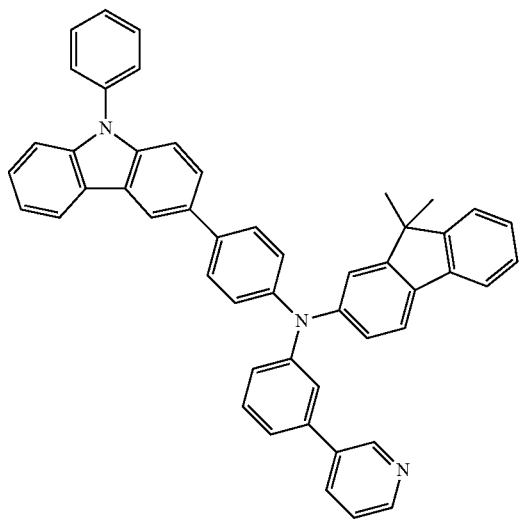

-continued
HT15
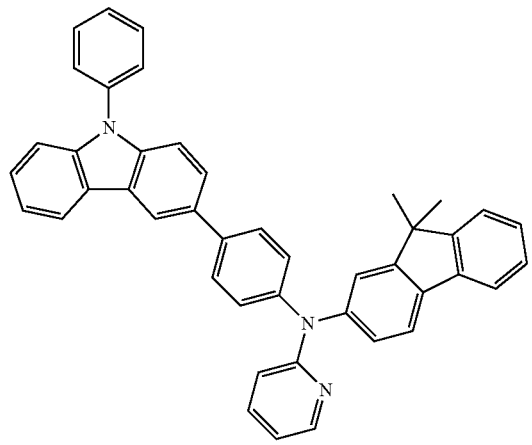
HT16
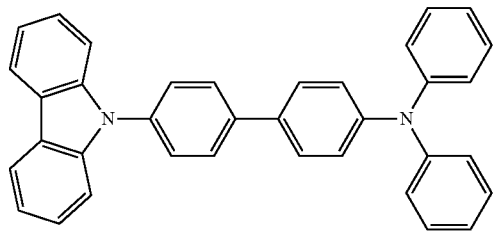
HT17
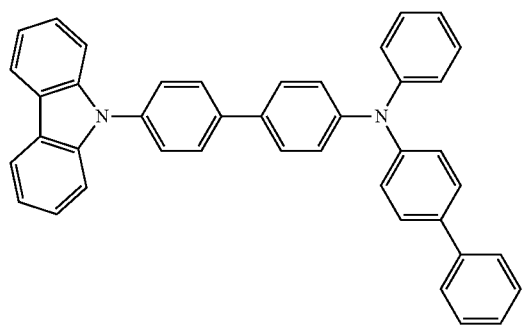
HT18
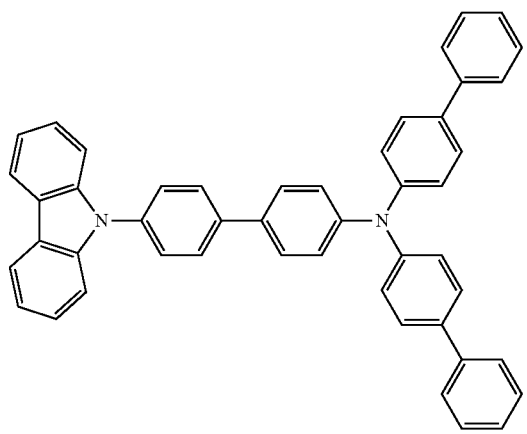
HT19
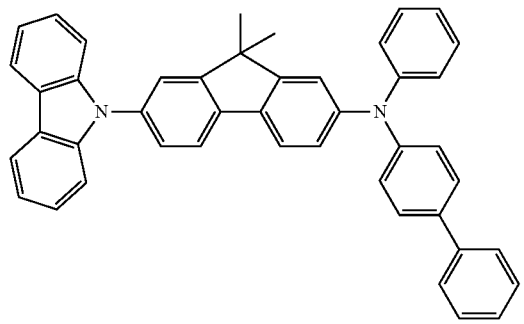
HT20
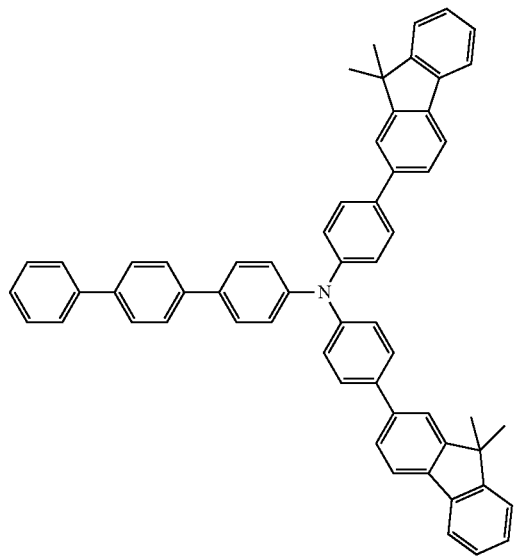

-continued
HT21
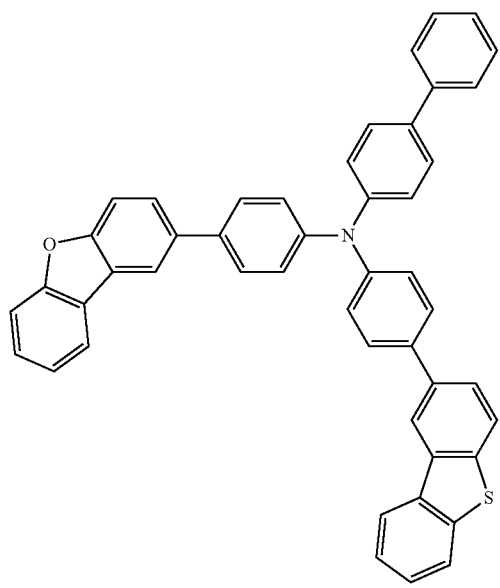
HT22
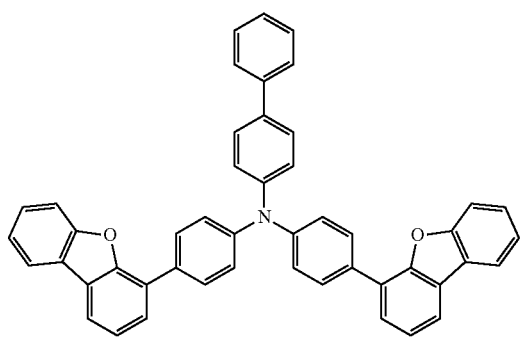
HT23
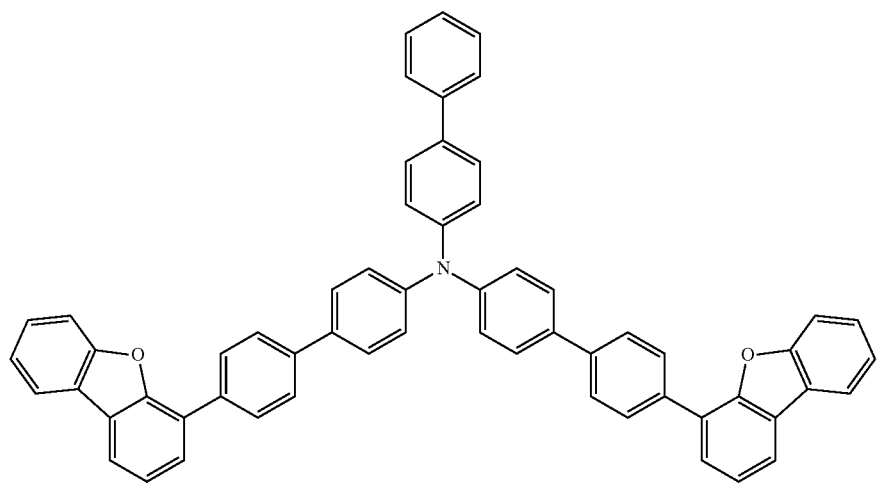
HT24
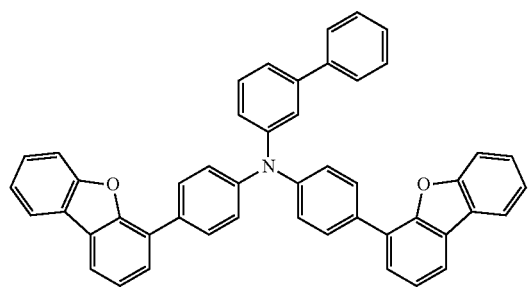
HT25
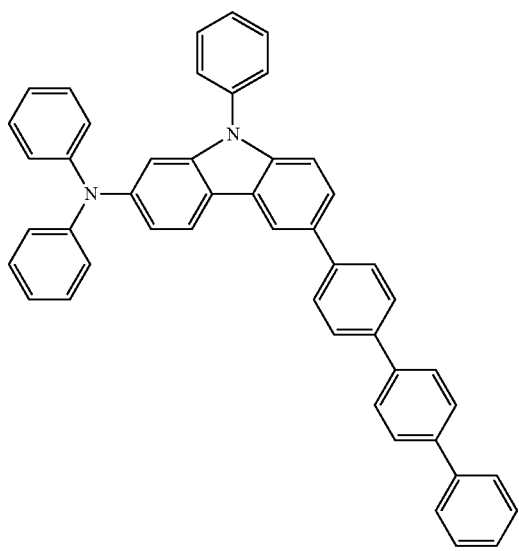

-continued
HT26
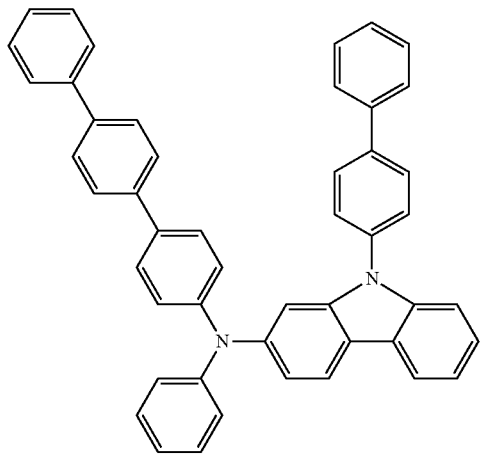
HT27
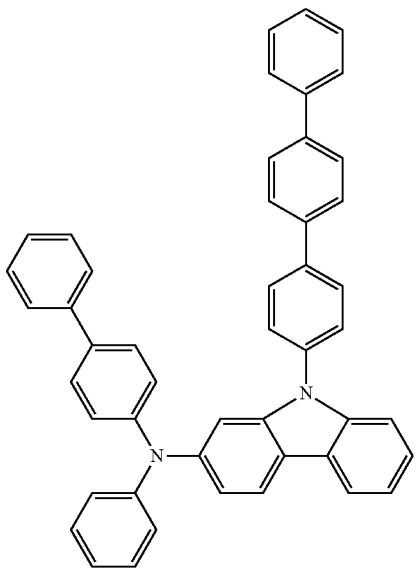
HT28
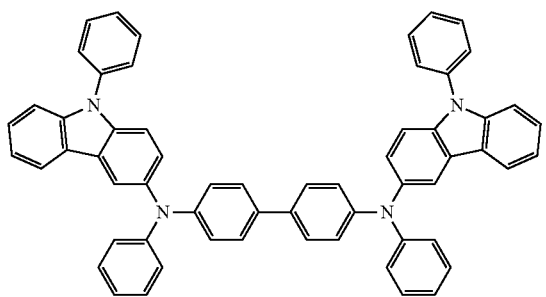
HT29
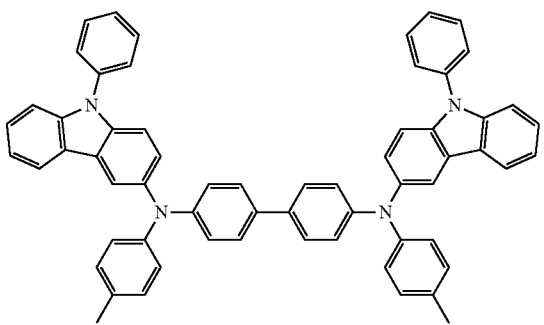
HT30
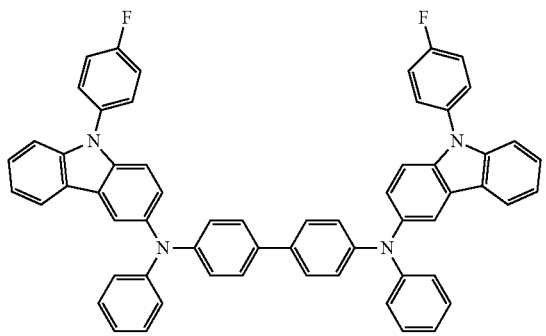
HT31
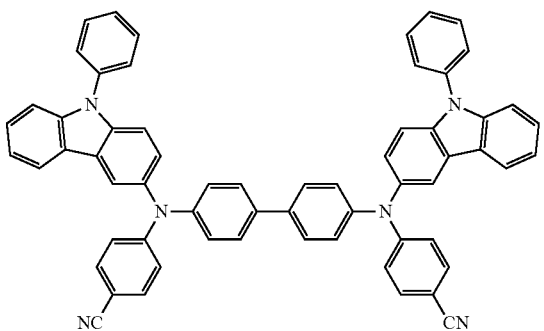

-continued
HT32
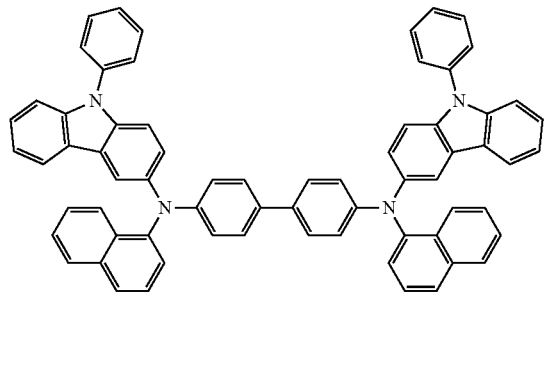
HT33
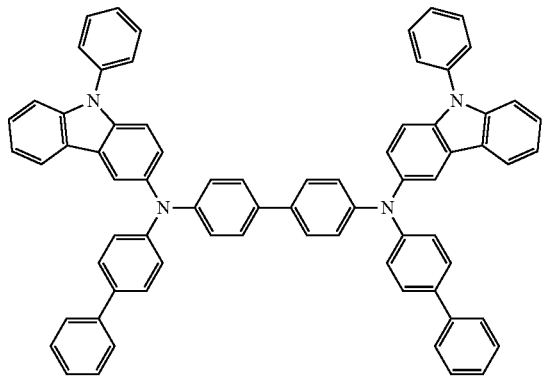
HT34
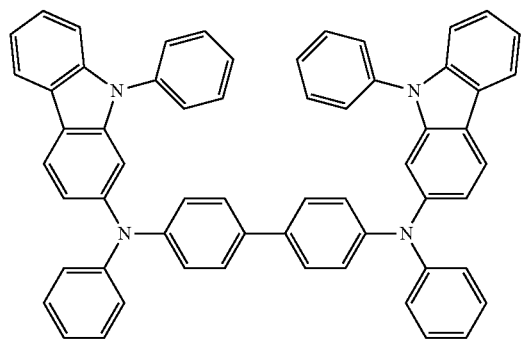
HT35
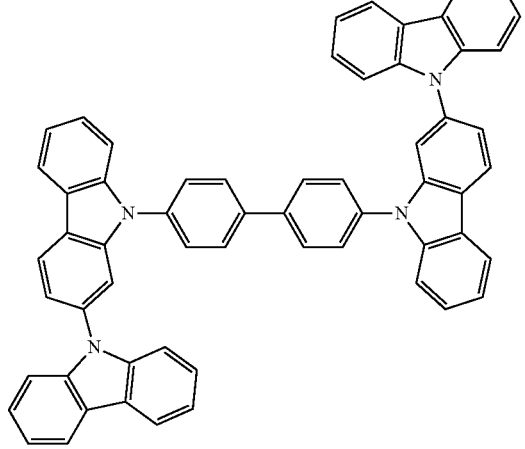
HT36
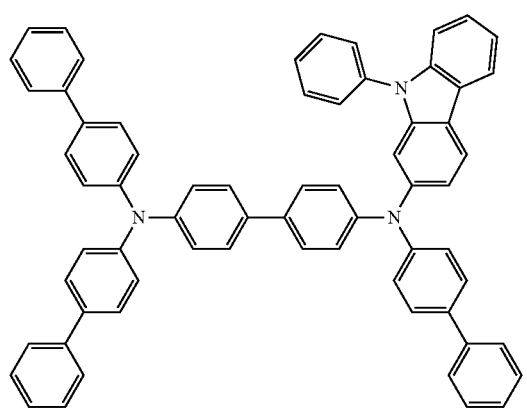
HT37
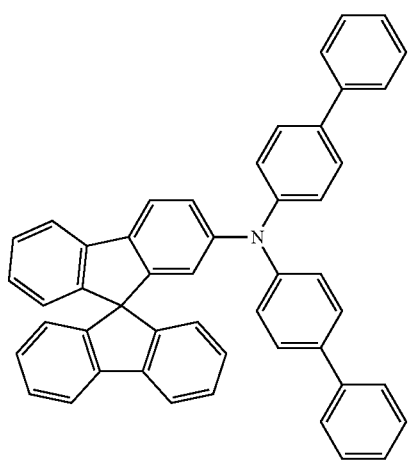

-continued

HT38

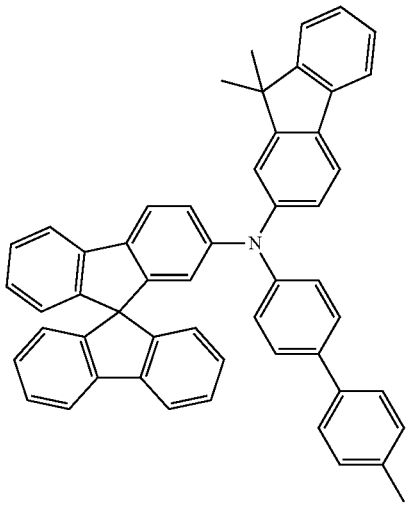

HT39

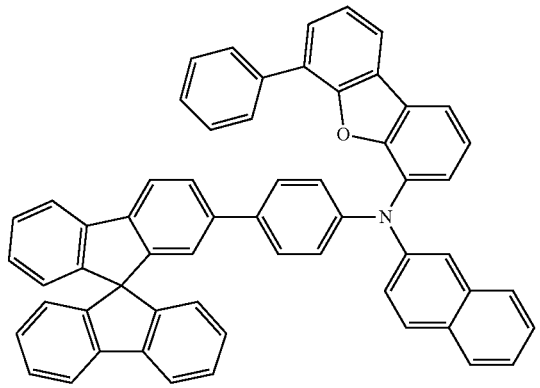

The thickness of the hole transport region may be in a range of about 100 (Angstroms) Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials, to improve conductive properties of the hole transport region. The charge generating material may be substantially homogeneously or non-homogeneously dispersed in the hole transport region.

The charge-generating material may be, for example, a p-dopant.

In an embodiment, a lowest unoccupied molecular orbital (LUMO) of the p-dopant may be −3.5 eV or less.

The p-dopant may include at least one selected from a quinone derivative, a metal oxide, and a cyano group-containing compound, but embodiments are not limited thereto.

In some embodiments, the p-dopant may be selected from a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but embodiments are not limited thereto:

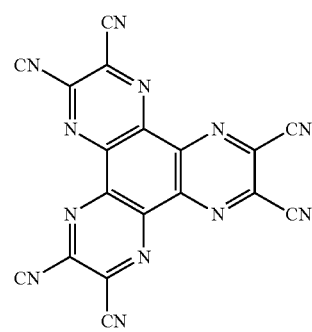

HAT-CN

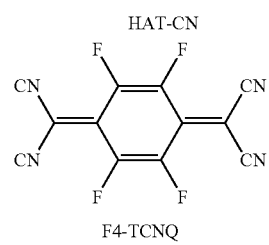

F4-TCNQ

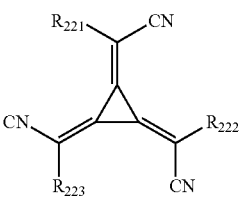

Formula 221 wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Electron Transport Region in Organic Layer 150

The electron transport region may have i) a single-layered structure consisting of a single layer consisting of a single material, ii) a single-layered structure consisting of a single layer including a plurality of different materials, or iii) a multi-layered structure each having a plurality of layers, each having a plurality of different materials.

The electron transport region may include at least one selected from a buffer layer, a hole blocking layer, an electron control layer, an electron transport layer, and an electron injection layer, but embodiments are not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order, but embodiments are not limited thereto.

The electron transport region (for example, the buffer layer, the hole blocking layer, the electron control layer, or the electron transport layer in the electron transport region) may include a metal-free compound including at least one π electron-depleted nitrogen-containing ring.

The term "π electron-depleted nitrogen-containing ring" as used herein refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed, or iii) a heteropolycyclic group in which at least one of a 5-membered to 7-membered heteromonocyclic group, each having at least one *—N=*' moiety, is condensed with at least one $C_5$-$C_{60}$ carbocyclic group.

Examples of the π electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but embodiments are not limited thereto.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O) ($Q_{601}$), —S(=O)$_2$($Q_{601}$), and —P(=O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one selected from $Ar_{601}$(s) in the number of xe11 and $R_{601}$(s) in the number of xe21 may include the π electron-depleted nitrogen-containing ring.

In some embodiments, in Formula 601, $Ar_{601}$ may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two $Ar_{601}$(s) may be bound via a single bond.

In one or more embodiments, $Ar_{601}$ in Formula 601 may be an anthracene group.

In one or more embodiments, a compound represented by Formula 601 may be represented by Formula 601-1:

Formula 601-1

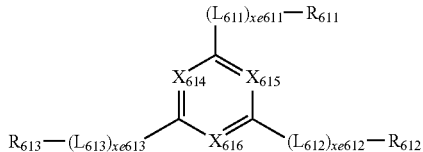

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xe613 in Formulae 601 and 601-1 may each independently be 0, 1, or 2.

In one embodiment, in Formulae 601 and 601-1, $R_{601}$ and $R_{611}$ to $R_{613}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein $Q_{601}$ and $Q_{602}$ may respectively be understood by referring to the descriptions of $Q_{601}$ and $Q_{602}$ provided herein.

The electron transport region may include at least one compound selected from Compounds ET1 to ET36, but embodiments are not limited thereto:

ET1
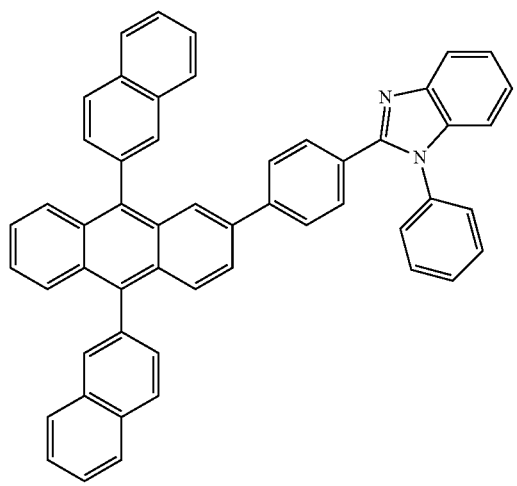
ET2
ET3
ET4
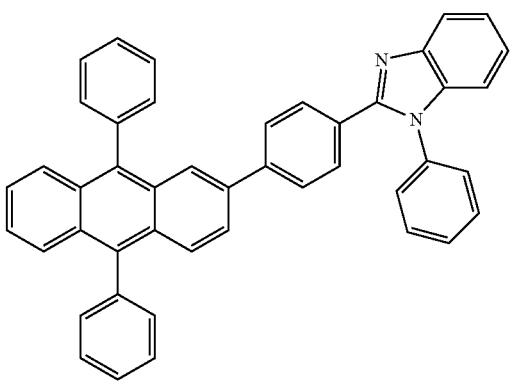
ET5
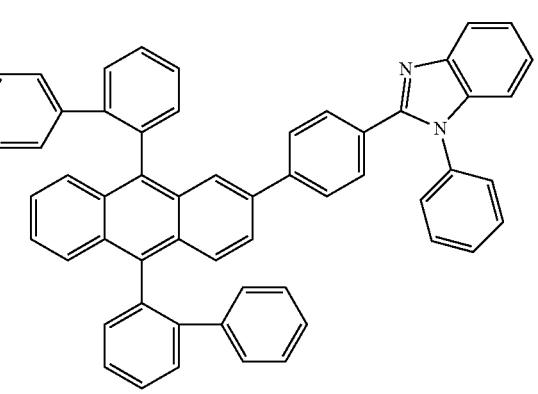
ET6
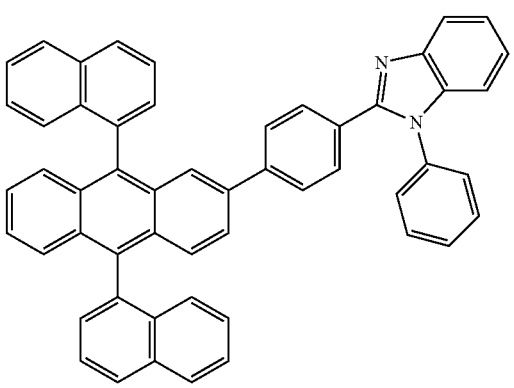

ET7
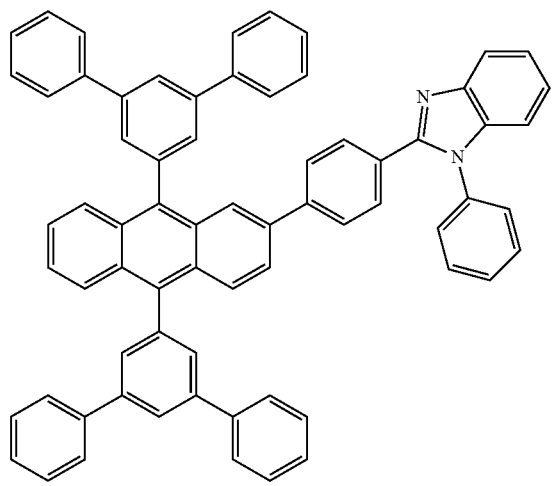
ET8
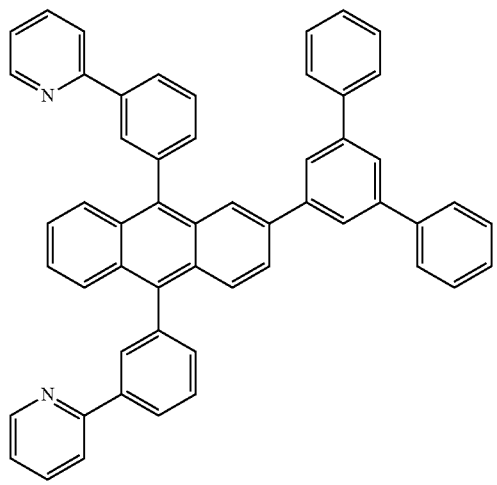
ET9
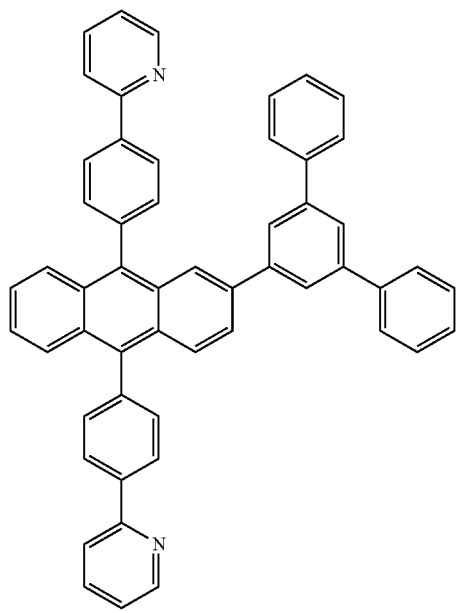
ET10
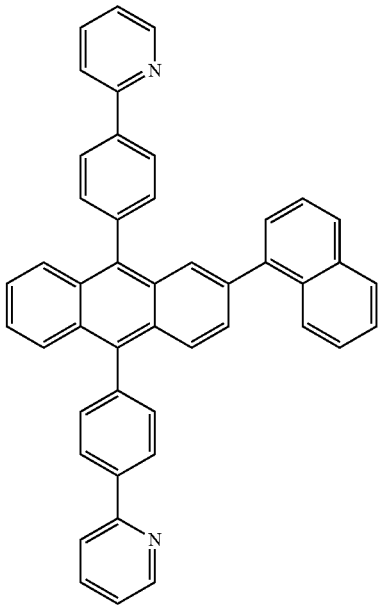
ET11
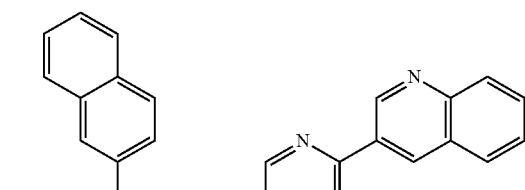
ET12
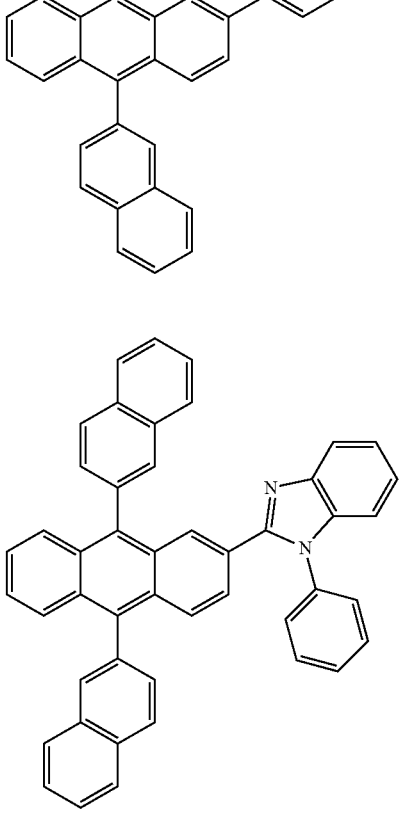

ET13
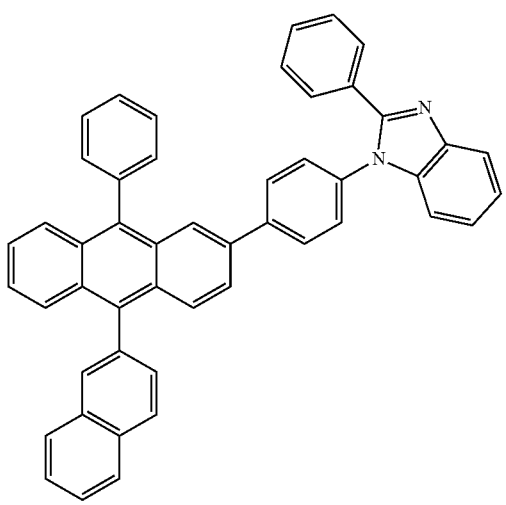
ET14
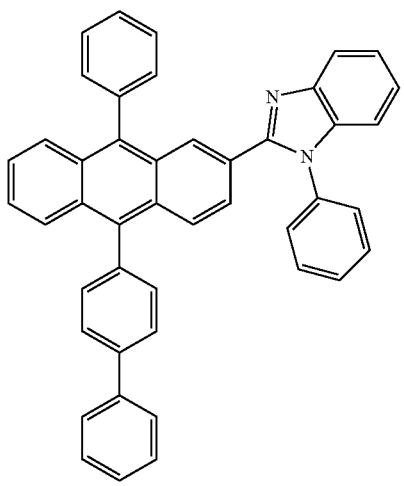
ET15
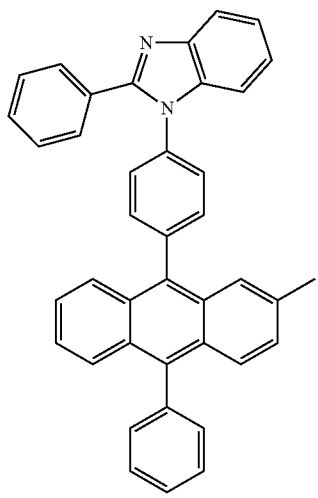
ET16
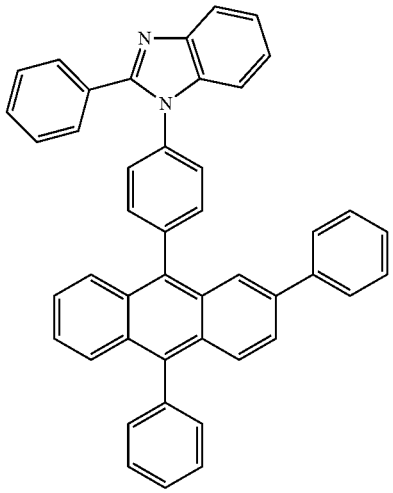
ET17
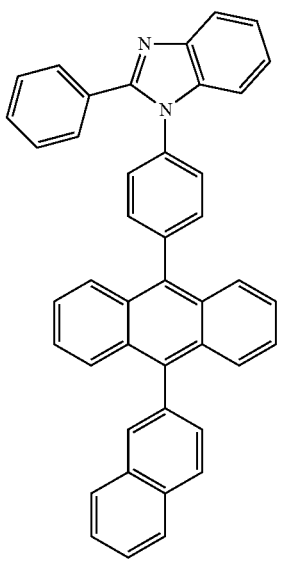
ET18
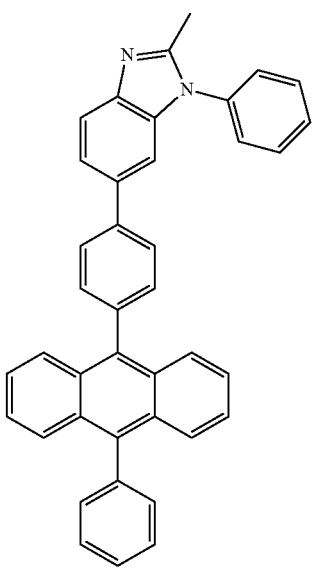

-continued
ET19
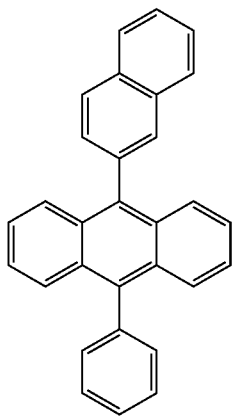
ET20
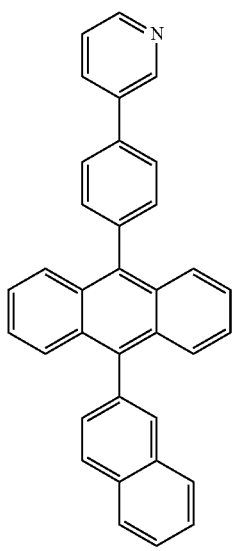
ET21
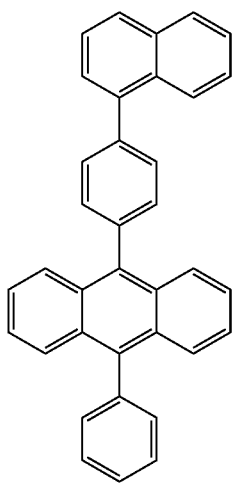
-continued
ET22
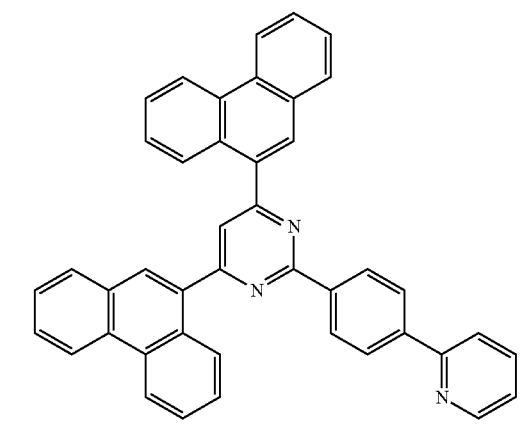
ET23
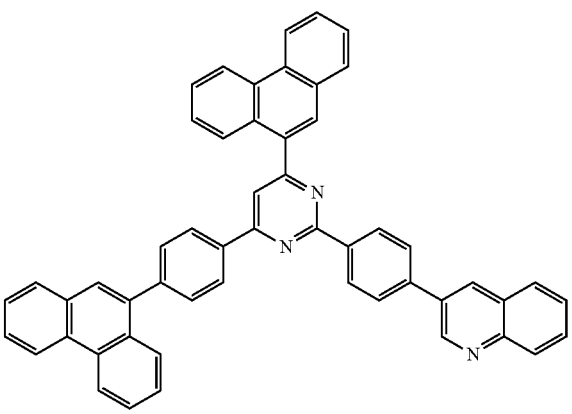
ET24
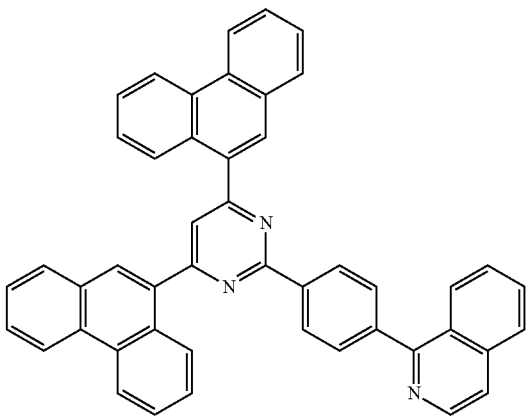

ET25
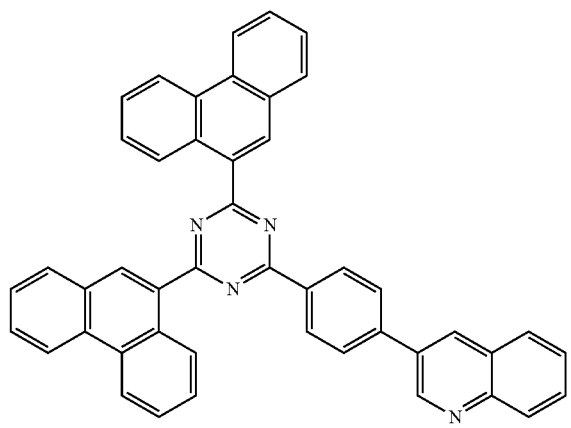
ET26
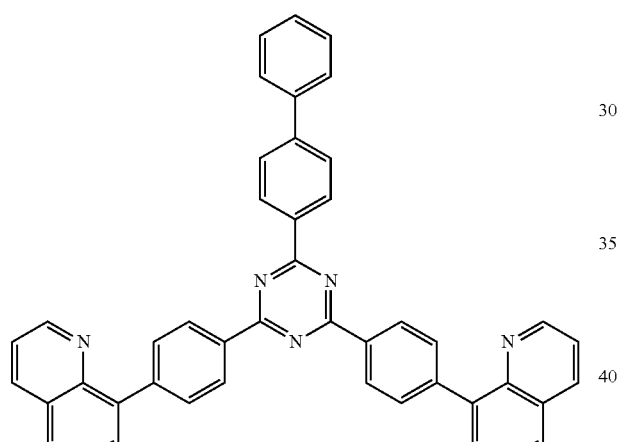
ET27
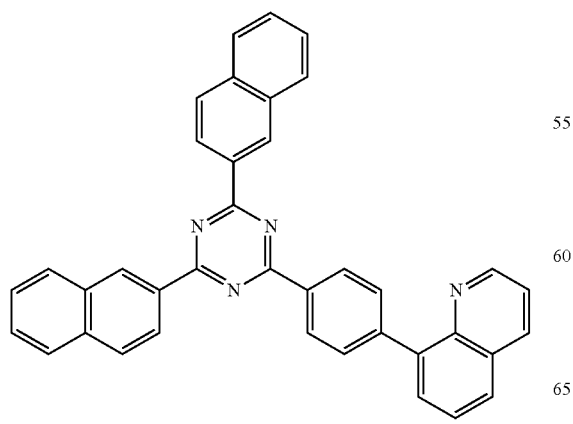
ET28
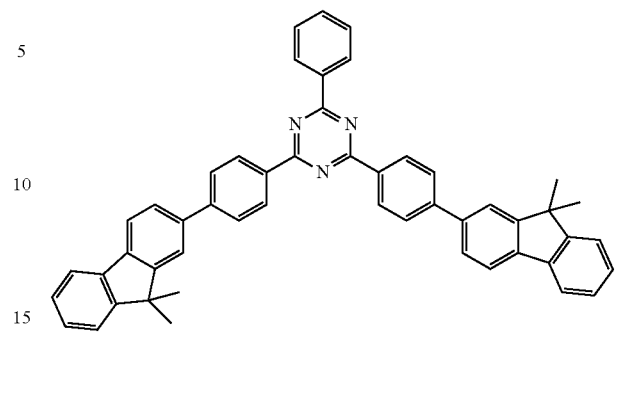
ET29
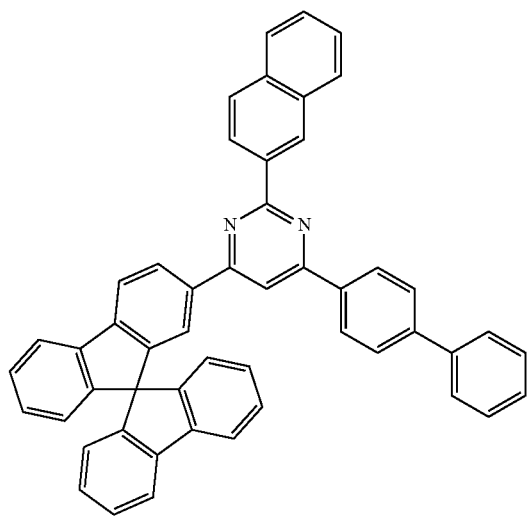
ET30
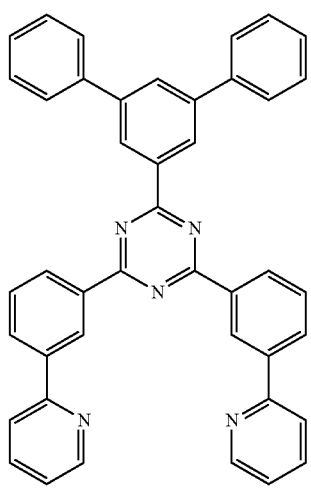

ET31
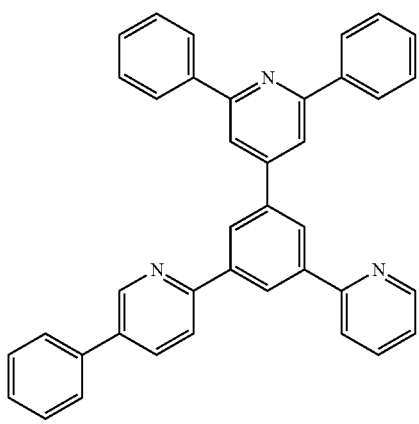
ET34
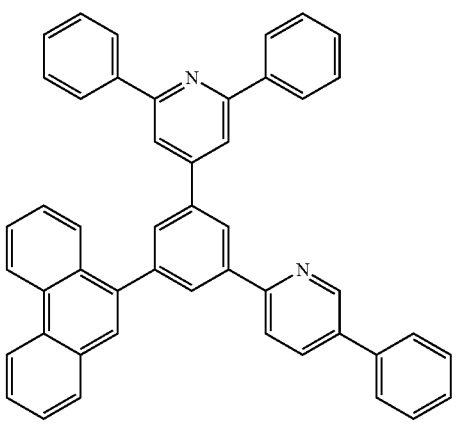
ET32
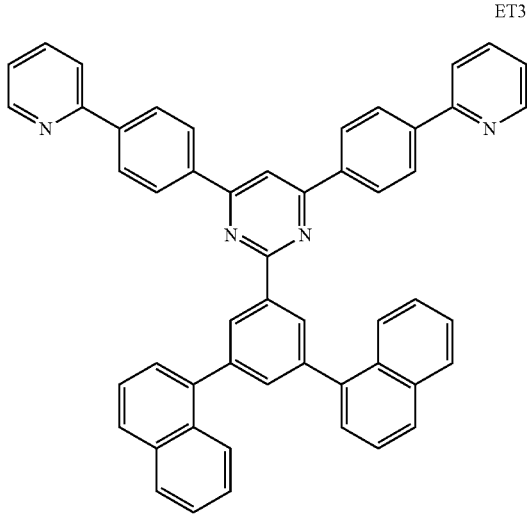
ET35
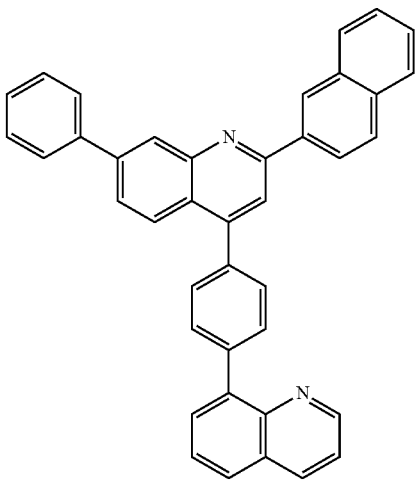
ET33
ET36
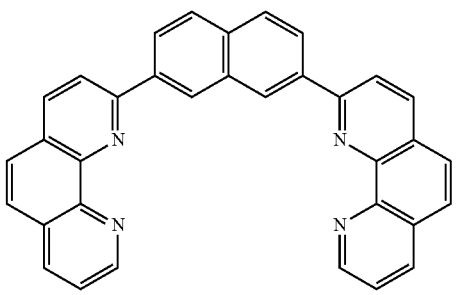
In some embodiments, the electron transport region may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), NTAZ, and diphenyl(4-(triphenylsilyl)phenyl)-phosphine oxide (TSPO1):

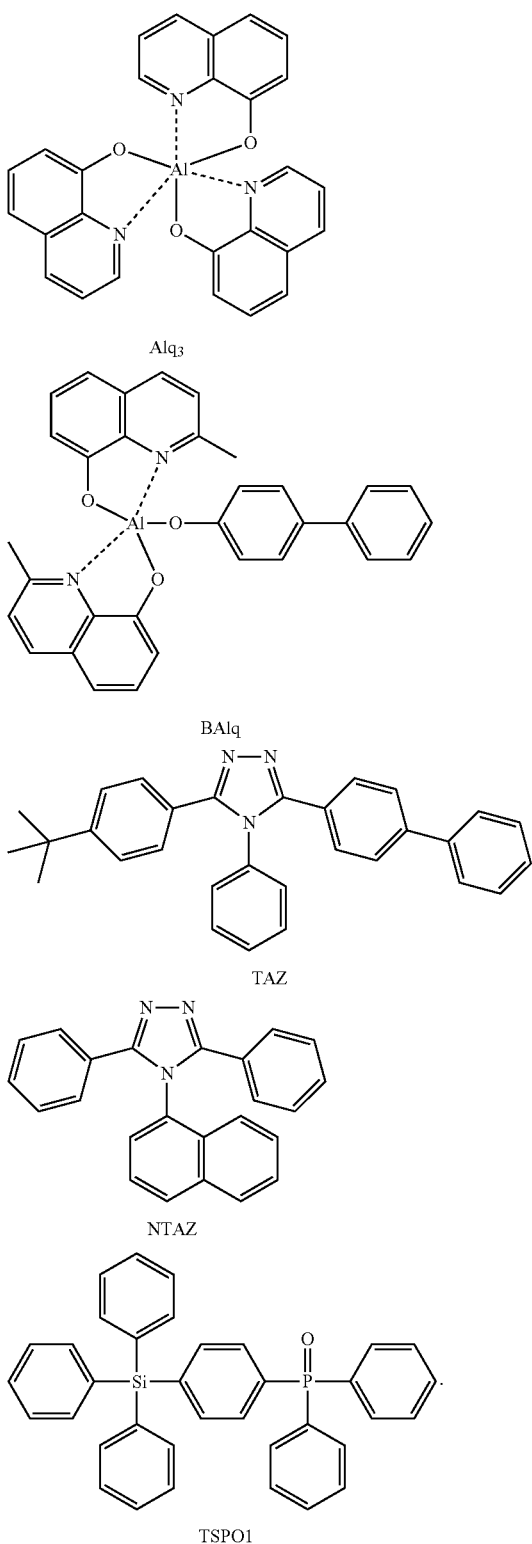

Alq3

BAlq

TAZ

NTAZ

TSPO1

The thicknesses of the buffer layer, the hole blocking layer, or the electron control layer may each independently be in a range of about 20 Å to about 1,000 Å, and in some embodiments, about 30 Å to about 300 Å. When the thicknesses of the buffer layer, the hole blocking layer or the electron control layer are within any of these ranges, excel- lent hole blocking characteristics or excellent electron con- trolling characteristics may be obtained without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from hydroxyqui- noline, hydroxyisoquinoline, hydroxybenzoquinoline, hydroxyacridine, hydroxyphenanthridine, hydroxypheny- loxazole, hydroxyphenylthiazole, hydroxyphenyloxadiaz- ole, hydroxyphenylthiadiazole, hydroxyphenylpyridine, hydroxyphenylbenzimidazole, hydroxyphenylbenzothiaz- ole, bipyridine, phenanthroline, and cyclopentadiene, but embodiments are not limited thereto.

For example, the metal-containing material may include a Li complex. The Li complex may include, e.g., Compound ET-D1 (LiQ) or Compound ET-D2:

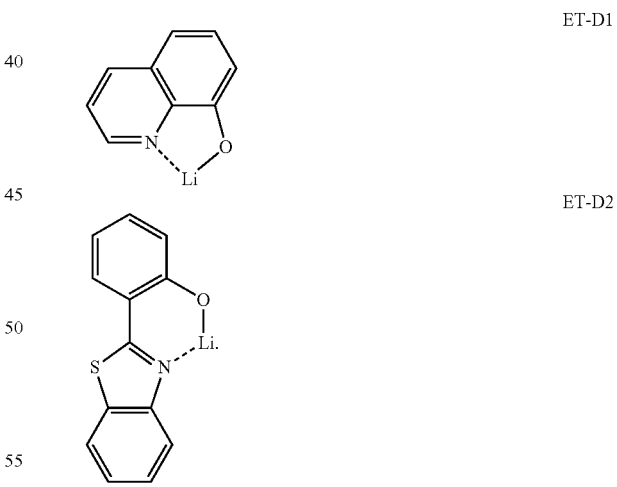

ET-D1

ET-D2

The electron transport region may include an electron injection layer that facilitates injection of electrons from the second electrode 190. The electron injection layer may be in direct contact with the second electrode 190.

The electron injection layer may have i) a single-layered structure consisting of a single layer consisting of a single material, ii) a single-layered structure consisting of a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In an embodiment, the alkali metal may be Li, Na, or Cs. In one or more embodiments, the alkaline metal may be Li or Cs, but is not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In an embodiment, the alkali metal compound may be selected from LiF, $Li_2O$, NaF, LiI, NaI, CsI, and KI, but embodiments are not limited thereto.

The alkaline earth-metal compound may be selected from alkaline earth-metal compounds, such as BaO, SrO, CaO, $Ba_xSr_{1-x}O$ (wherein 0<x<1), and $Ba_xCa_{1-x}O$ (wherein 0<x<1). In an embodiment, the alkaline earth metal compound may be selected from BaO, SrO, and CaO, but embodiments are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Second Electrode 190

The second electrode 190 may be on the organic layer 150. In an embodiment, the second electrode 190 may be a cathode that is an electron injection electrode. In this embodiment, a material for forming the second electrode 190 may be a material having a low work function, for example, a metal, an alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure, or a multi-layered structure including two or more layers.

Figures 3, 4:
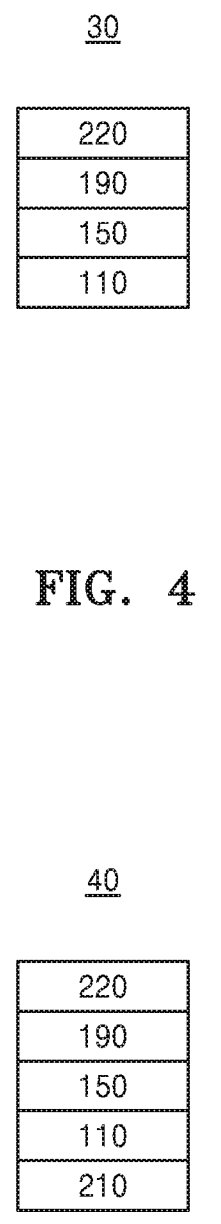

Description of FIGS. 2 to 4

Referring to FIG. 2, an organic light-emitting device 20 has a first capping layer 210, the first electrode 110, the organic layer 150, and the second electrode 190 structure, wherein the layers are sequentially stacked in this stated order. Referring to FIG. 3, an organic light-emitting device 30 has the first electrode 110, the organic layer 150, the second electrode 190, and a second capping layer 220 structure, wherein the layers are sequentially stacked in this stated order. Referring to FIG. 4, an organic light-emitting device 40 has the first capping layer 210, the first electrode 110, the organic layer 150, the second electrode 190, and the second capping layer 220 structure, wherein the layers are stacked in this stated order.

The first electrode 110, the organic layer 150, and the second electrode 190 illustrated in FIGS. 2 to 4 may be substantially the same as those illustrated in FIG. 1.

In the organic light-emitting devices 20 and 40, light emitted from the emission layer in the organic layer 150 may pass through the first electrode 110 (which may be a semi-transmissive electrode or a transmissive electrode) and through the first capping layer 210 to the outside. In the organic light-emitting devices 30 and 40, light emitted from the emission layer in the organic layer 150 may pass through the second electrode 190 (which may be a semi-transmissive electrode or a transmissive electrode) and through the second capping layer 220 to the outside.

The first capping layer 210 and the second capping layer 220 may improve the external luminescence efficiency based on the principle of constructive interference.

The first capping layer 210 and the second capping layer 220 may each independently be a capping layer including an organic material, an inorganic capping layer including an inorganic material, or a composite capping layer including an organic material and an inorganic material.

At least one of the first capping layer 210 and the second capping layer 220 may each independently include at least one material selected from carbocyclic compounds, heterocyclic compounds, amine-based compounds, porphine derivatives, phthalocyanine derivatives, naphthalocyanine derivatives, alkali metal complexes, and alkaline earth metal complexes. The carbocyclic compound, the heterocyclic compound, and the amine-based compound may optionally be substituted with a substituent containing at least one element selected from O, N, S, Se, Si, F, Cl, Br, and I. In an embodiment, at least one of the first capping layer 210 and the second capping layer 220 may each independently include an amine-based compound.

In one or more embodiments, at least one of the first capping layer 210 and the second capping layer 220 may each independently include a compound represented by Formula 201 or a compound represented by 202.

In one or more embodiments, at least one of the first capping layer 210 and the second capping layer 220 may each independently include a compound selected from Compounds HT28 to HT33 and Compound CP1 to CP5, but embodiments are not limited thereto:

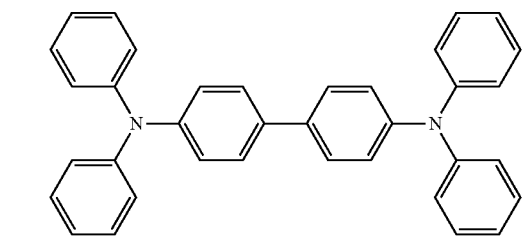
CP1

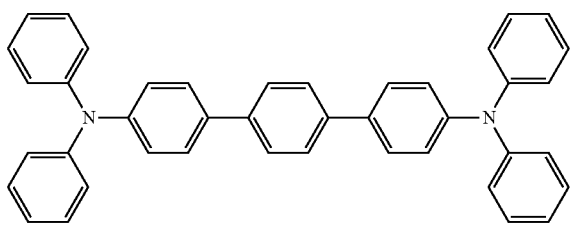
CP2

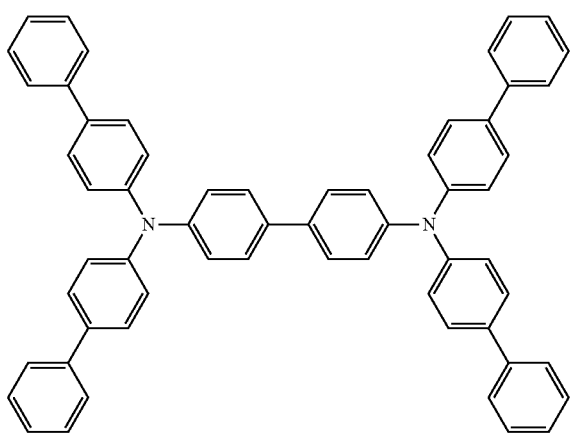
CP3

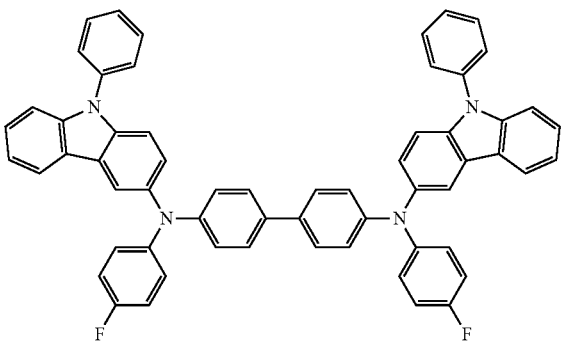
CP4

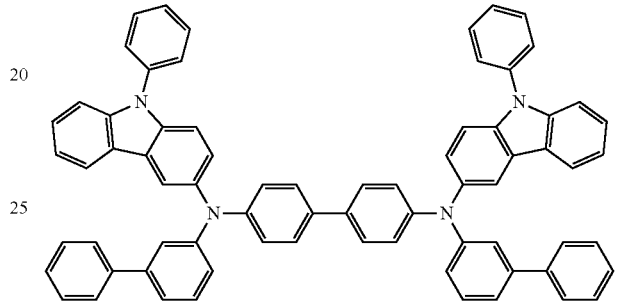
CP5

Hereinbefore, the organic light-emitting device has been described with reference to FIGS. 1 to 4, but embodiments are not limited thereto.

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

The organic light-emitting device may be included in various apparatuses.

In some embodiments, an apparatus may include a source electrode, a drain electrode, and thin film transistor including an active layer; and the organic light-emitting device. A first electrode of the organic light-emitting device may be electrically connected to one of the source electrode and the drain electrode of the thin-film transistor.

The thin-film transistor may further include a gate electrode, a gate insulating film, or the like.

The active layer may include a crystalline silicon, an amorphous silicon, an organic semiconductor, and an oxide semiconductor, but embodiments are not limited thereto.

The apparatus may further include a sealing portion for sealing the organic light-emitting device. The sealing portion may enable image realization from the organic light-emitting device and prevention of air and moisture permeation into the organic light-emitting device. The sealing portion may be a sealing substrate including a transparent glass or a plastic substrate. The sealing portion may be a thin film encapsulating layer including a plurality of organic layers and/or a plurality of inorganic layers. When the sealing portion is a thin film encapsulating layer, the apparatus as a whole may be flexible.

In some embodiments, the apparatus may be an emission apparatus, an authentication apparatus, or an electronic apparatus.

The emission apparatus may be used in various displays, light sources, or the like.

The authentication apparatus may be, for example, a biometric authentication apparatus that identifies an individual according biometric information (e.g., a fingertip, a pupil, or the like). The authentication apparatus may further include a biometric information collecting unit, in addition to the organic light-emitting device described above.

The electronic apparatus may be applicable to a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, but embodiments are not limited thereto.

General Definitions of Substituents

The term "$C_1$-$C_{10}$ alkyl group" as used herein refers to a linear or branched aliphatic hydrocarbon monovalent group having 1 to 10 carbon atoms. Examples thereof include a methyl group, an ethyl group, a propyl group, an iso-butyl group, a sec-butyl group, a tert-butyl group, a pentyl group, an iso-amyl group, and a hexyl group.

The term "$C_2$-$C_{10}$ alkenyl group" as used herein refers to a hydrocarbon group having at least one carbon-carbon double bond in the middle or at the terminus of the $C_2$-$C_{10}$ alkyl group. Examples thereof include an ethenyl group, a propenyl group, and a butenyl group.

The term "$C_2$-$C_{10}$ alkynyl group" as used herein refers to a hydrocarbon group having at least one carbon-carbon triple bond in the middle or at the terminus of the $C_2$-$C_{10}$ alkyl group. Examples thereof include an ethynyl group and a propynyl group.

The term "$C_1$-$C_{10}$ alkoxy group" as used herein refers to a monovalent group represented by —$OA_{101}$ (wherein $A_{101}$ is a $C_1$-$C_{10}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "heterocycloalkyl group having 1 to 10 ring-forming atoms" as used herein refers to a monovalent monocyclic group including at least one heteroatom selected from N, O, Si, P, and S as a ring-forming atom and 1 to 10 ring-forming atoms. Examples thereof include a 1,2,3,4-oxatriazolidinyl group, a tetrahydrofuranyl group, and a tetrahydrothiophenyl group.

The term "$C_3$-$C_{15}$ cycloalkenyl group" as used herein refers to a monovalent monocyclic group that has 3 to 15 carbon atoms and at least one double bond in its ring, and is not aromatic. Examples thereof include a cyclopentenyl group, a cyclohexenyl group, and a cycloheptenyl group.

The term "heterocycloalkenyl group having 1 to 15 ring-forming atoms" as used herein refers to a monovalent monocyclic group including at least one heteroatom selected from N, O, Si, P, and S as a ring-forming atom, 1 to 15 ring-forming atoms, and at least one double bond in its ring. Examples of the heterocycloalkenyl group having 1 to 15 ring-forming atoms include a 4,5-dihydro-1,2,3,4-oxatriazolyl group, a 2,3-dihydrofuranyl group, and a 2,3-dihydrothiophenyl group.

The term "$C_6$-$C_{15}$ aryl group" as used herein refers to a monovalent group having a carbocyclic aromatic system having 6 to 15 carbon atoms. Examples of the $C_6$-$C_{15}$ aryl group include a phenyl group, a naphthyl group, an anthracenyl group, a phenanthrenyl group, a pyrenyl group, and a chrysenyl group. When the $C_6$-$C_{15}$ aryl group includes a plurality of rings, the rings may be condensed.

The term "$C_6$-$C_{15}$ aryloxy group" as used herein indicates —$OA_{102}$ (wherein $A_{102}$ is a $C_6$-$C_{15}$ aryl group), and a $C_6$-$C_{15}$ arylthio group as used herein indicates —$SA_{103}$ (wherein $A_{103}$ is a $C_6$-$C_{15}$ aryl group).

The term "heteroaryl group having 1 to 15 ring-forming atoms" as used herein refers to a monovalent group having a heterocyclic aromatic system including at least one heteroatom selected from N, O, Si, P, and S as a ring-forming atom and 1 to 15 ring-forming atoms. Examples of the heteroaryl group having 1 to 15 ring-forming atoms include a pyridinyl group, a pyrimidinyl group, a pyrazinyl group, a pyridazinyl group, a triazinyl group, a quinolinyl group, and an isoquinolinyl group. When the heteroaryl group having 1 to 15 ring-forming atoms includes a plurality of rings, the rings may be condensed.

The term "heteroaryloxy group having 1 to 15 ring-forming atoms" as used herein indicates —$OA_{104}$ (wherein $A_{104}$ is a heteroaryloxy group having 1 to 15 ring-forming atoms). The term "heteroarylthio group having 1 to 15 ring-forming atoms" as used herein indicates —$SA_{105}$ (wherein $A_{105}$ is a heteroarylthio group having 1 to 15 ring-forming atoms).

The term "monovalent non-aromatic condensed polycyclic group having 1 to 15 ring-forming atoms" as used herein refers to a monovalent group that has two or more rings condensed and only carbon atoms as ring forming atoms (e.g., 1 to 15 carbon atoms), wherein the entire molecular structure is non-aromatic. An example of the monovalent non-aromatic condensed polycyclic group having 1 to 15 ring-forming atoms may be a fluorenyl group.

The term "monovalent non-aromatic condensed heteropolycyclic group having 1 to 15 ring-forming atoms" as used herein refers to a monovalent group that has two or more condensed rings and at least one heteroatom selected from N, O, Si, P, and S, in addition to carbon atoms (e.g., 1 to 15 carbon atoms), as a ring-forming atom, wherein the entire molecular structure is non-aromatic. An example of the monovalent non-aromatic condensed heteropolycyclic group having 1 to 15 ring-forming atoms may be a carbazolyl group.

The term "$C_5$-$C_{15}$ carbocyclic group" as used herein refers to a monocyclic or polycyclic group having 5 to 15 carbon atoms only as ring-forming atoms. The $C_5$-$C_{15}$ carbocyclic group may be an aromatic carbocyclic group or a non-aromatic carbocyclic group. The term "$C_5$-$C_{15}$ carbocyclic group" as used herein refers to a ring (e.g., a benzene group), a monovalent group (e.g., a phenyl group), or a divalent group (e.g., a phenylene group). Also, depending on the number of substituents connected to the $C_5$-$C_{15}$ carbocyclic group, the $C_5$-$C_{15}$ carbocyclic group may be a trivalent group or a quadrivalent group.

The term "heterocyclic group having 1 to 15 ring-forming atoms" as used herein refers to a group having substantially the same structure as the $C_5$-$C_{15}$ carbocyclic group, except that at least one heteroatom selected from N, O, Si, P, and S is used as a ring-forming atom, in addition to carbon atoms.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter the compound and the organic light-emitting device according to an embodiment will be described in detail with reference to Examples.

EXAMPLES

Example 1

As an anode, a substrate on which ITO/Ag/ITO were deposited was cut to a size of 50 millimeters (mm)×50 mm×0.5 mm, sonicated in isopropyl alcohol and pure water for 5 minutes in each solvent, cleaned with ultraviolet rays for 30 minutes, and then ozone, and mounted on a vacuum deposition apparatus.

m-MTDATA was deposited on the ITO substrate to form a hole injection layer having a thickness of 40 Å. NPB was vacuum-deposited on the hole injection layer to form a hole transport layer having a thickness of 10 Å. Compounds HT-09, ET08, and TBD-01 were co-deposited in a weight ratio of 70:30:25 on the hole transport layer to form an emission layer having a thickness of 300 Å. ET-1 was deposited on the emission layer to form an electron transport layer having a thickness of 300 Å. Thereafter, aluminum (Al) was deposited on the electron injection layer to form a cathode having a thickness of about 1,200 Å, thereby completing the manufacture of an organic light-emitting device.

Examples 2 to 5 and Comparative Examples 1 and 5

Organic light-emitting devices were manufactured in the same manner as in Example 1, except that compounds shown in Table 1 were used in the formation of the emission layer.

Evaluation Example

Figure 6:
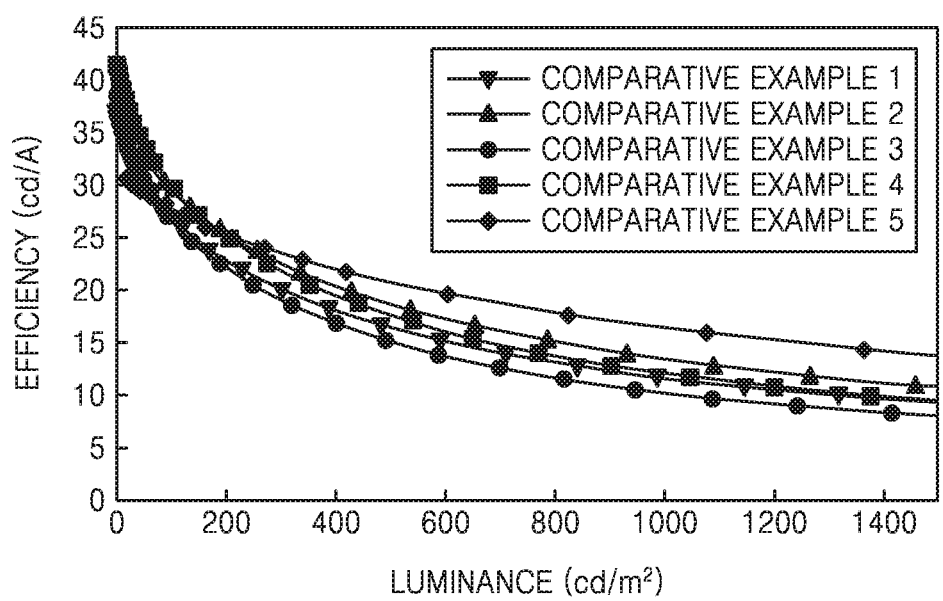
FIG. 6 is a graph of luminance (candela per square meter, $cd/m^2$) versus efficiency (candela per Ampere, cd/A) of organic light-emitting devices prepared in Comparative Examples 1 to 5.

The emission color, current density, and lifespan of the organic light-emitting devices manufactured in Examples 1 to 5 and Comparative Examples 1 to 5 were measured by using Kethley source-measure unit (SMU) 236 and a PR650 luminance meter at a current density of 10 milliamperes per square meter (mA/cm$^2$). The results thereof are shown in Table 1. Here, the lifespan indicates time for the initial luminance to reduce by 80%. In addition, the changes in efficiency (roll-off characteristics) of the organic light-emitting device of Examples 1 to 5 and Comparative Examples 1 to 5 versus luminance were measured. The results thereof are shown in FIGS. 5 and 6.

TABLE 1

| | Emission layer | | | | | | |
|---|---|---|---|---|---|---|---|
| | First compound | Second compound | Third compound | Weight ratio (first compound:second compound:third compound) | Emission color | Efficiency (cd/A) | Lifespan (hr) |
| Example 1 | TBD-01 | ET08 | HT-09 | 25:30:70 | Blue | 19.2 | 40 |
| Example 2 | TBD-04 | ET015 | HT-07 | 25:50:50 | Blue | 26.0 | 38 |
| Example 3 | TBD-07 | ET05 | HT-04 | 25:70:30 | Blue | 25.6 | 47 |
| Example 4 | TBD-13 | ET015 | HT-08 | 25:30:70 | Blue | 24.6 | 54 |
| Example 5 | TBD-13 | ET015 | HT-08 | 25:30:70 | Blue | 26.0 | 59 |
| Comparative Example 1 | TBD-13 | — | HT-08 | 25:0:100 | Blue | 11.5 | 24 |
| Comparative Example 2 | TBD-13 | ET015 | — | 25:100:0 | Blue | 16.4 | 19 |
| Comparative Example 3 | TBD-13 | — | HT-08 | 25:0:100 | Blue | 13 | 29 |
| Comparative Example 4 | TBD-08 | — | HT-04 | 25:0:100 | Blue | 31 | 18 |
| Comparative Example 5 | X | Y | HT-07 | 25:50:50 | Blue | 20.4 | 26 |

TABLE 1-continued
| | Emission layer | | | | | |
|---|---|---|---|---|---|---|
| First compound | Second compound | Third compound | Weight ratio (first compound:second compound:third compound) | Emission color | Efficiency (cd/A) | Lifespan (hr) |
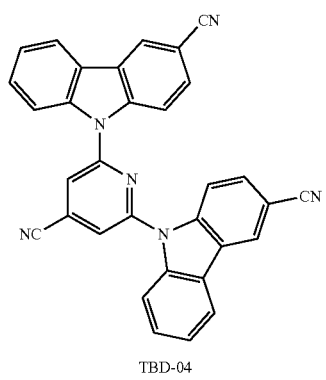 [SMILES: N#Cc1cc(-n2c3ccccc3c3cc(C#N)ccc32)nc(-n2c3ccccc3c3cc(C#N)ccc32)c1]
TBD-01
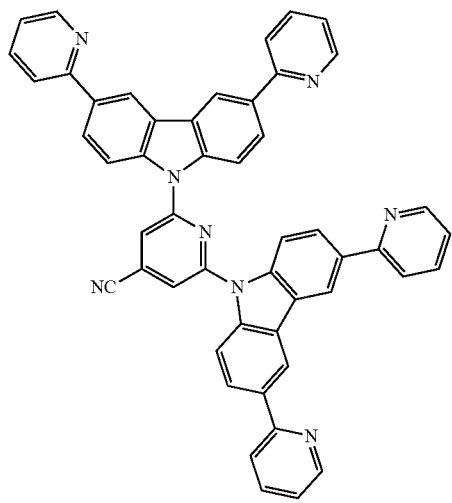
TBD-04
TBD-07

TABLE 1-continued

| | Emission layer | | | | | |
|---|---|---|---|---|---|---|
| First compound | Second compound | Third compound | Weight ratio (first compound:second compound:third compound) | Emission color | Efficiency (cd/A) | Lifespan (hr) |

TBD-13

ET05

ET08

ET015

TABLE 1-continued
| | | Emission layer | | | | |
|---|---|---|---|---|---|---|
| First compound | Second compound | Third compound | Weight ratio (first compound:second compound:third compound) | Emission color | Efficiency (cd/A) | Lifespan (hr) |
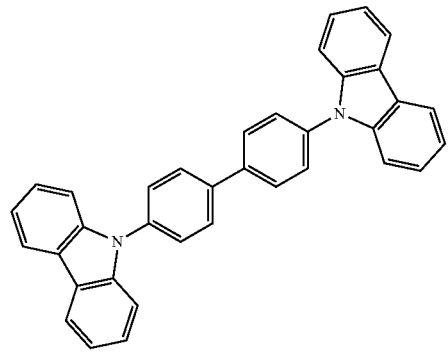
HT-04
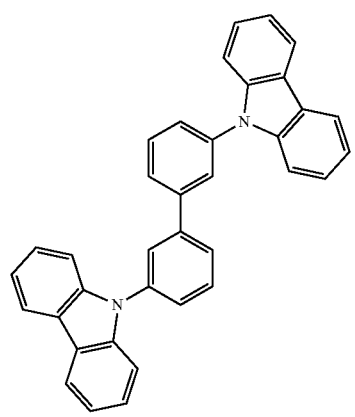
HT-07
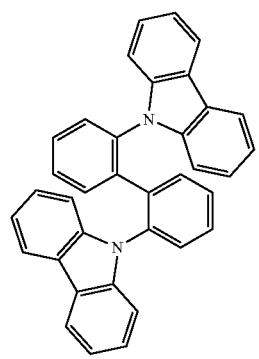
HT-08

TABLE 1-continued

| Emission layer | | | | | | |
|---|---|---|---|---|---|---|
| First compound | Second compound | Third compound | Weight ratio (first compound:second compound:third compound) | Emission color | Efficiency (cd/A) | Lifespan (hr) |

HT-09

X

Y

Referring to the results of Table 1, it was found that the organic light-emitting devices of Examples 1 to 5 exhibited excellent current efficiency and lifespan, as compared with the organic light-emitting devices of Comparative Examples 1 to 5.

Further, as shown in FIGS. 5 and 6, the organic light-emitting devices of Examples 1 to 5 were found to have smaller decrease in efficiency at a high luminance (i.e., excellent roll-off characteristics) than the organic light-emitting devices of Comparative Examples 1 to 5.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. An organic light-emitting device comprising:
a first electrode;
a second electrode; and
an organic layer between the first electrode and the second electrode,
wherein the organic layer comprises an emission layer, the emission layer comprises a first compound, a second compound, and a third compound, the first compound is represented by Formula 1, the second compound is represented by Formula 2, the third compound is represented by Formula 3, and the first compound, the second compound, and the third compound are different from one another:

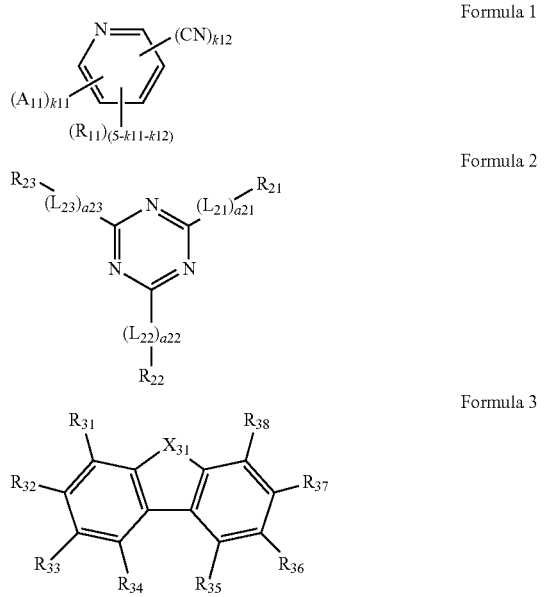

Formula 1

Formula 2

Formula 3 wherein in Formulae 1 to 3, $A_{11}$ is a group represented by Formula 10:

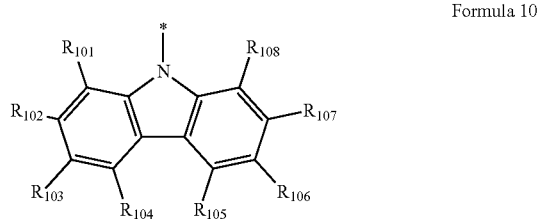

Formula 10 wherein, in Formula 10, $R_{101}$ to $R_{108}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_8$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), k11 and k12 are each independently selected from 1, 2, 3, and 4, $R_{11}$ is selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), $L_{21}$ to $L_{23}$ are each independently selected from a $C_5$-$C_{15}$ carbocyclic group and a heterocyclic group having 1 to 15 ring-forming atoms, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —C($Q_{31}$)($Q_{32}$)($Q_{33}$), —Si($Q_{31}$)($Q_{32}$)($Q_{33}$), —B($Q_{31}$)($Q_{32}$), —N($Q_{31}$)($Q_{32}$), —P($Q_{31}$)($Q_{32}$), —C(=O)($Q_1$), —S(=O)($Q_{31}$), —S(=O)$_2$($Q_{31}$), —P(=O)($Q_{31}$)($Q_{32}$), and —P(=S)($Q_{31}$)($Q_{32}$), a21 to a23 are each independently selected from 0, 1, and 2, $R_{21}$ to $R_{23}$ are each independently selected from a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, and a monovalent non-aromatic condensed heteropolycyclic group having 1 to 15 ring-forming atoms, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —$C(Q_{31})(Q_{32})(Q_{33})$, —$Si(Q_{31})(Q_{32})(Q_{33})$, —$B(Q_{31})(Q_{32})$, —$N(Q_{31})(Q_{32})$, —$P(Q_{31})(Q_{32})$, —$C(=O)(Q_1)$, —$S(=O)(Q_{31})$, —$S(=O)_2(Q_{31})$, —$P(=O)(Q_{31})(Q_{32})$, and —$P(=S)(Q_{31})(Q_{32})$; and —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, $X_{31}$ is selected from $N(R_{39})$ and $C(R_{39})(R_{40})$, $R_{31}$ to $R_{40}$ are each independently selected from a group represented by *-$(L_{31})_{a31}$-$A_{31}$, hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, provided that at least one selected from $R_{31}$ to $R_{39}$ is a group represented by *-$(L_3)_{a31}$-$A_{31}$, $L_{31}$ is a phenylene group unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —$C(Q_{31})(Q_{32})(Q_{33})$, —$Si(Q_{31})(Q_{32})(Q_{33})$, —$B(Q_{31})(Q_{32})$, —$N(Q_{31})(Q_{32})$, —$P(Q_{31})(Q_{32})$, —$C(=O)(Q_1)$, —$S(=O)(Q_{31})$, —$S(=O)_2(Q_{31})$, —$P(=O)(Q_{31})(Q_{32})$, and —$P(=S)(Q_{31})(Q_{32})$, a31 is selected from 1, 2, and 3, and $A_{31}$ is selected from a carbazolyl group and a fluorenyl group, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, —$C(Q_{31})(Q_{32})(Q_{33})$, —$Si(Q_{31})(Q_{32})(Q_{33})$, —$B(Q_{31})(Q_{32})$, —$N(Q_{31})(Q_{32})$, —$P(Q_{31})(Q_{32})$, —$C(=O)(Q_1)$, —$S(=O)(Q_{31})$, —$S(=O)_2(Q_{31})$, —$P(=O)(Q_{31})(Q_{32})$, and —$P(=S)(Q_{31})(Q_{32})$, wherein $Q_1$ to $Q_3$ and $Q_{31}$ to $Q_{33}$ are each independently selected from hydrogen, deuterium, —F, —Cl, —Br, —I, $C_1$-$C_{10}$ alkyl group, a $C_2$-$C_{10}$ alkenyl group, a $C_2$-$C_{10}$ alkynyl group, a alkoxy group, a $C_3$-$C_{10}$ cycloalkyl group, a heterocycloalkyl group having 1 to 10 ring-forming atoms, a $C_3$-$C_{15}$ cycloalkenyl group, a heterocycloalkenyl group having 1 to 15 ring-forming atoms, a $C_6$-$C_{15}$ aryl group, a $C_6$-$C_{15}$ aryloxy group, a $C_6$-$C_{15}$ arylthio group, a heteroaryl group having 1 to 15 ring-forming atoms, a heteroaryloxy group having 1 to 15 ring-forming atoms, a heteroarylthio group having 1 to 15 ring-forming atoms, a monovalent non-aromatic condensed polycyclic group having 1 to 15 ring-forming atoms, a monovalent non-aromatic condensed heteropolycyclic group having 1 to 15 ring-forming atoms, a biphenyl group, and a terphenyl group, and

* indicates a binding site to an adjacent atom, and wherein the organic light-emitting device emits delayed fluorescence.

2. The organic light-emitting device of claim 1, wherein k11 and k12 are each independently selected from 1 and 2.

3. The organic light-emitting device of claim 1, wherein the first compound is represented by any one of Formulae 1-1 to 1-58:

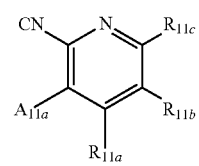

1-1

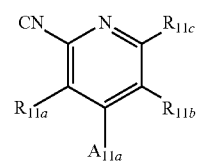

1-2

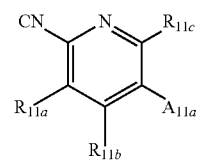

1-3

-continued
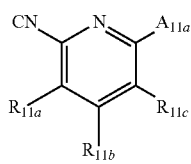
1-4
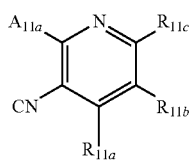
1-5
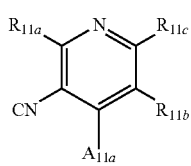
1-6
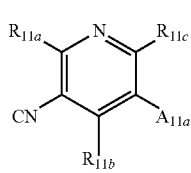
1-7
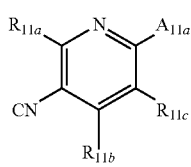
1-8
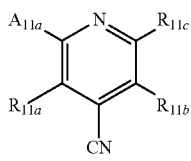
1-9
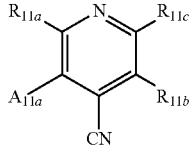
1-10
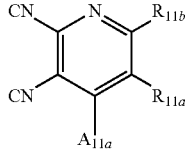
1-11
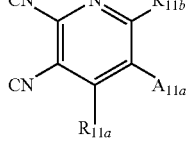
1-12
-continued
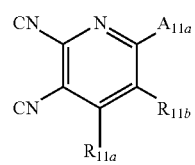
1-13
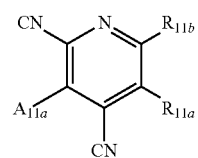
1-14
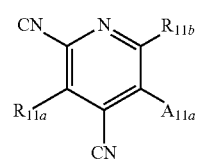
1-15
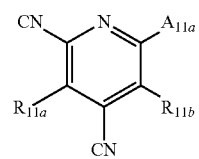
1-16
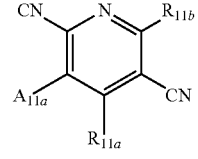
1-17
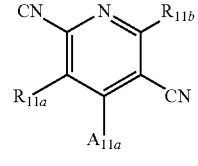
1-18
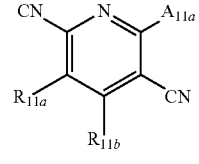
1-19
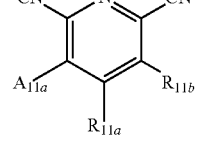
1-20
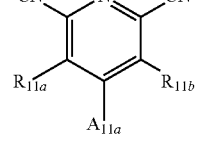
1-21

-continued

| | |
|---|---|
| 1-22 | 1-31 |
| 1-23 | 1-32 |
| 1-24 | 1-33 |
| 1-25 | 1-34 |
| 1-26 | 1-35 |
| 1-27 | 1-36 |
| 1-28 | 1-37 |
| 1-29 | 1-38 |
| 1-30 | 1-39 |

-continued
1-40 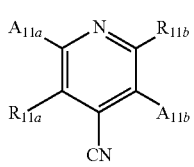
1-41 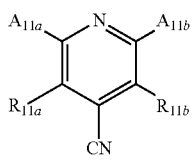
1-42 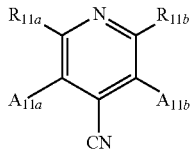
1-43 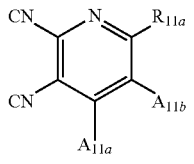
1-44 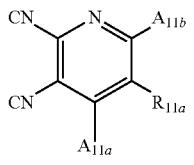
1-45 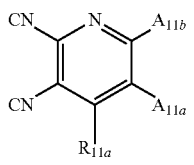
1-46 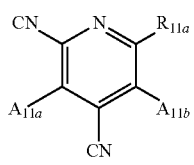
1-47 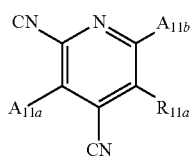
1-48 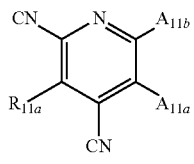
1-49 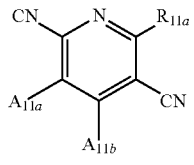
-continued
1-50 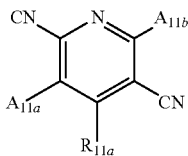
1-51 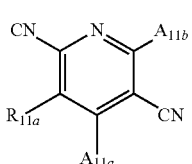
1-52 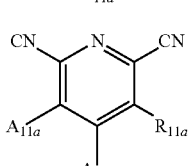
1-53 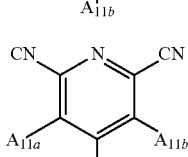
1-54 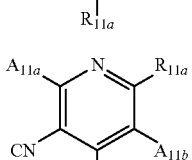
1-55 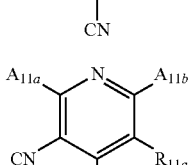
1-56 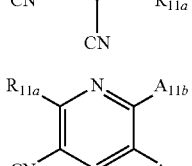
1-57 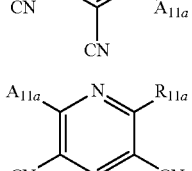
1-58 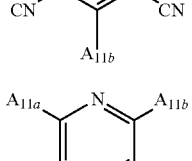
wherein, in Formulae 1-1 to 1-58,
$A_{11a}$ and $A_{11b}$ are each understood by referring to the description of $A_{11}$ in Formula 1, and
$R_{11a}$, $R_{11b}$, and $R_{11c}$ are each understood by referring to the description of $R_{11}$ in Formula 1.

4. The organic light-emitting device of claim 1, wherein $A_{11}$ is represented by any one of Formulae 10-1 and 10-2:

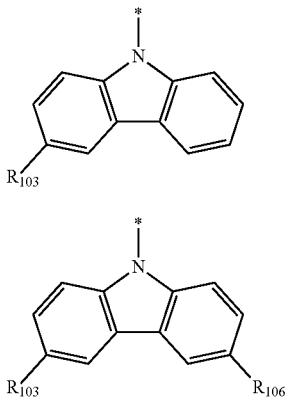

wherein, in Formulae 10-1 and 10-2, $R_{103}$ and $R_{106}$ are each independently selected from —F, a cyano group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, and

* indicates a binding site to an adjacent atom.

5. The organic light-emitting device of claim 1, wherein $R_{11}$ is selected from hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_3$-$C_{15}$ cycloalkenyl group, a heterocycloalkenyl group having 1 to 15 ring-forming atoms, a $C_6$-$C_{15}$ aryl group, a heteroaryl group having 1 to 15 ring-forming atoms, a monovalent non-aromatic condensed polycyclic group having 1 to 15 ring-forming atoms, and a monovalent non-aromatic condensed heteropolycyclic group having 1 to 15 ring-forming atoms.

6. The organic light-emitting device of claim 1, wherein $R_{11}$ is hydrogen.

7. The organic light-emitting device of claim 1, wherein $L_{21}$ to $L_{23}$ are each independently selected from a benzene group, a naphthalene group, a phenalene group, an anthracene group, a phenanthrene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a quinazoline group, a benzoquinoxaline group, a benzoquinazoline group, a fluorene group, a carbazole group, a dibenzofuran group, a dibenzothiophene group, an azafluorene group, an azacarbazole group, an azadibenzofuran group, an azadibenzothiophene group, a diazafluorene group, a diazacarbazole group, a diazadibenzofuran group, and a diazadibenzothiophene group, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, and a21 to a23 are each independently selected from 0 and 1.

8. The organic light-emitting device of claim 1, wherein $R_{21}$ to $R_{23}$ are each independently selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each unsubstituted or substituted with at least one substituent selected from deuterium, —F, —Cl, —Br, —I, a hydroxyl group, a cyano group, a nitro group, an amidino group, a hydrazino group, a hydrazono group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, a diazadibenzothiophenyl group, —C($Q_{31}$)($Q_{32}$)($Q_{33}$), —Si($Q_{31}$)($Q_{32}$)($Q_{33}$), —B($Q_{31}$)($Q_{32}$), —N($Q_{31}$)($Q_{32}$), —P($Q_{31}$)($Q_{32}$), —C(=O)($Q_1$), —S(=O)($Q_{31}$), —S(=O)$_2$($Q_{31}$), —P(=O)($Q_{31}$)($Q_{32}$), and —P(=S)($Q_{31}$)($Q_{32}$); and —C($Q_1$)($Q_2$)($Q_3$), —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), wherein $Q_1$ to $Q_3$ and $Q_{31}$ to $Q_{33}$ are each independently selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

9. The organic light-emitting device of claim 1, wherein at least one selected from $R_{21}$ to $R_{23}$ is selected from a group represented by Formula 7-1, a group represented by Formula 7-2, —$C(Q_1)(Q_2)(Q_3)$, and —$Si(Q_1)(Q_2)(Q_3)$:

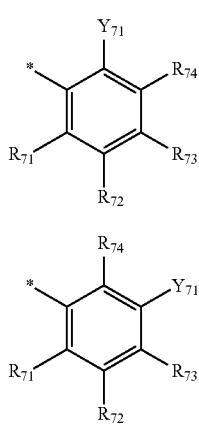

Formula 7-1

Formula 7-2 wherein, in Formulae 7-1 and 7-2,
$Y_{71}$ is selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$,
$R_{71}$ to $R_{74}$ are each independently selected from hydrogen, deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$,
$Q_1$ to $Q_3$ and $Q_{31}$ to $Q_{33}$ are each independently selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and
* indicates a binding site to an adjacent atom.

10. The organic light-emitting device of claim 1, wherein $X_{31}$ is $N(R_{39})$.

11. The organic light-emitting device of claim 1, wherein $R_{31}$ to $R_{40}$ are each independently selected from a group represented by *-$(L_{31})_{a31}$-$A_{31}$, hydrogen, deuterium, —F, —Cl, —Br, —I, a hydroxyl group, a cyano group, a nitro group, an amidino group, a hydrazino group, a hydrazono group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, provided that at least one selected from $R_{31}$ to $R_{39}$ is the group represented by *-$(L_{31})_{a31}$-$A_{31}$.

12. The organic light-emitting device of claim 1, wherein $L_{31}$ is a phenylene group unsubstituted or substituted with at least one substituent selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and
a31 is selected from 1 and 2.

13. The organic light-emitting device of claim 1, wherein $A_{31}$ is represented by any one of Formulae 8-1 to 8-5:

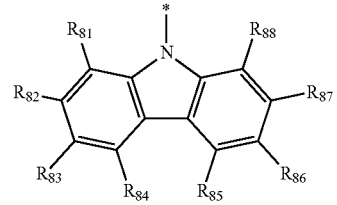

8-1

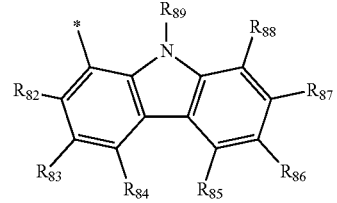

8-2

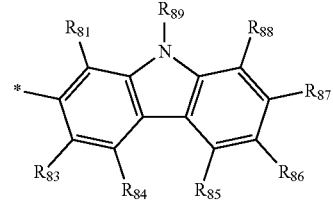

8-3

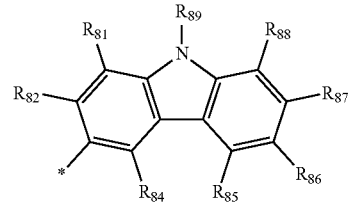

8-4

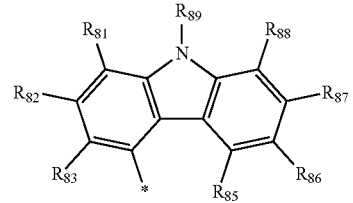

8-5 wherein, in Formulae 8-1 to 8-5,
$R_{81}$ to $R_{89}$ are each independently selected from hydrogen, a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and
* indicates a binding site to an adjacent atom.

14. The organic light-emitting device of claim 1, wherein the third compound is represented by any one of Formulae 3-1 to 3-5:

3-1
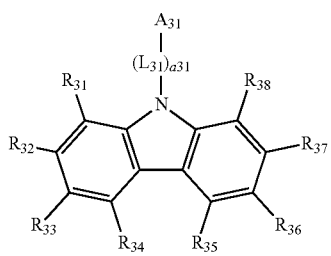
3-2
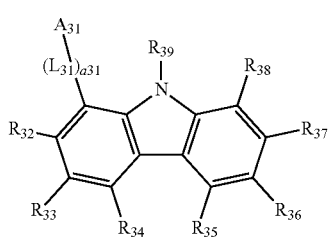
3-3
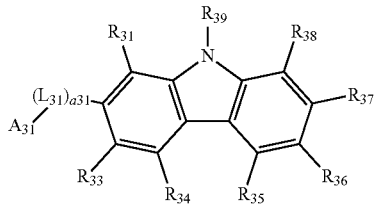
3-4
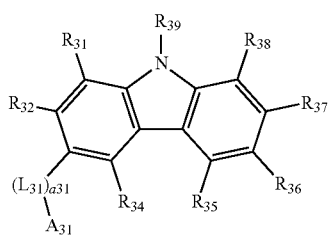
3-5
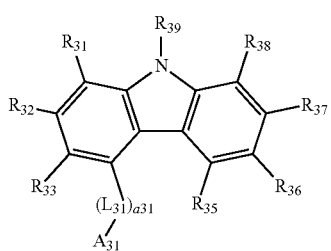
wherein, in Formulae 3-1 to 3-5,
$L_{31}$, a31, $A_{31}$, and $R_{31}$ to $R_{39}$ are respectively understood by referring to the descriptions of $L_{31}$, a31, $A_{31}$, and $R_{31}$ to $R_{39}$ in Formula 3.
15. The organic light-emitting device of claim 1, wherein the first compound is selected from Group I, the second compound is selected from Group II, and the third compound is selected from Group III:
Group I
TBD-01
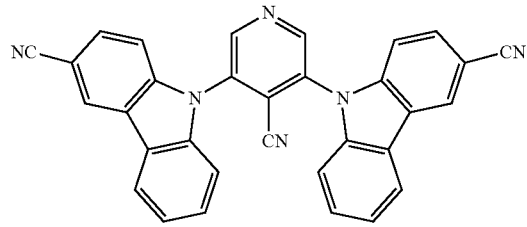
TBD-02
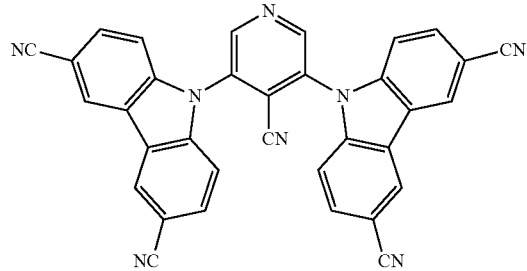
TBD-03
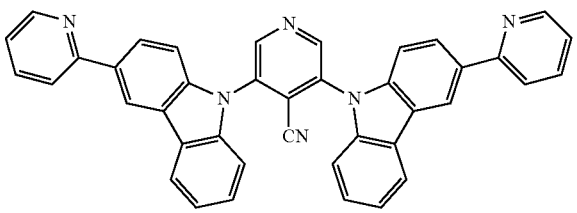
TBD-04
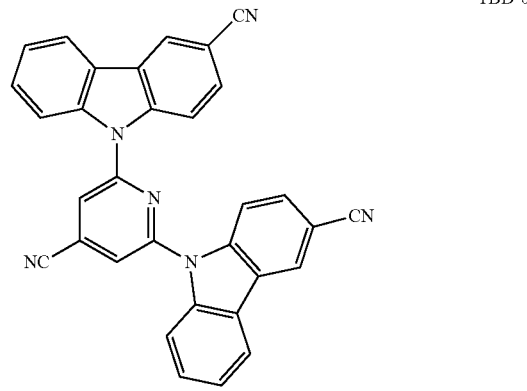
TBD-05
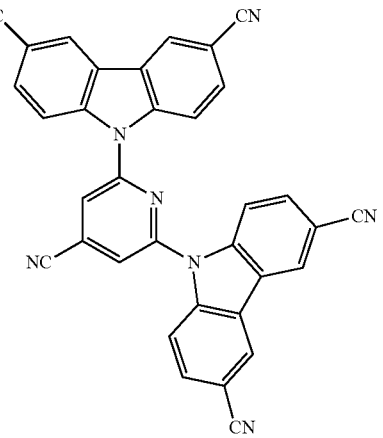

TBD-06
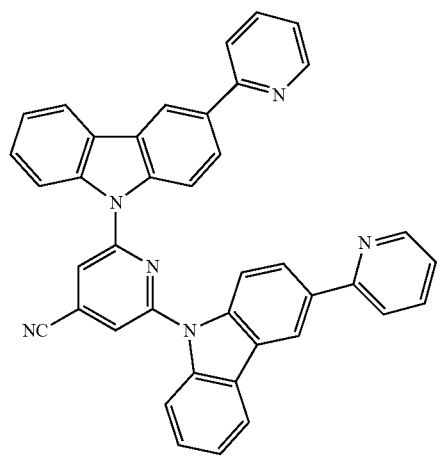
TBD-07
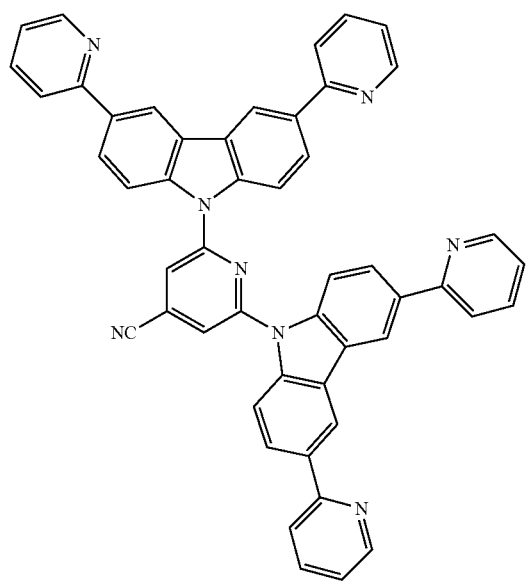
TBD-08
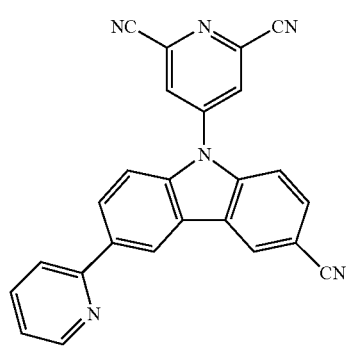
TBD-09
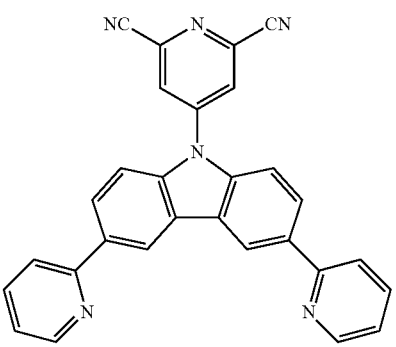
TBD-10
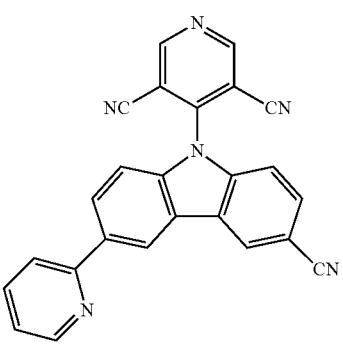
TBD-11
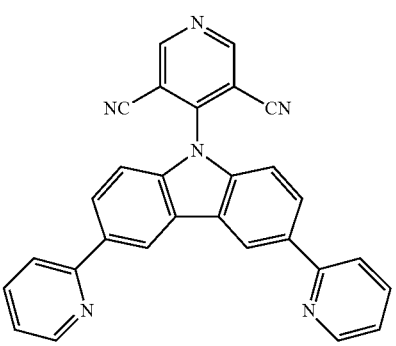
TBD-12
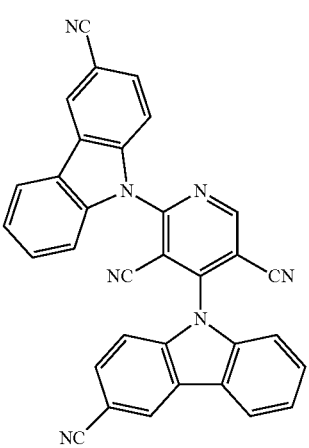

TBD-13
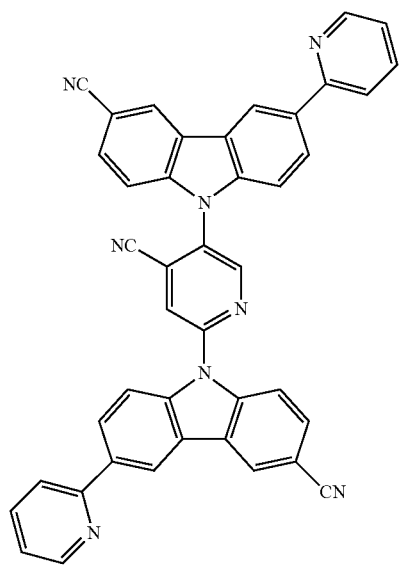
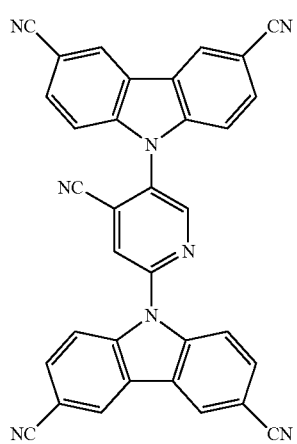
TBD-14
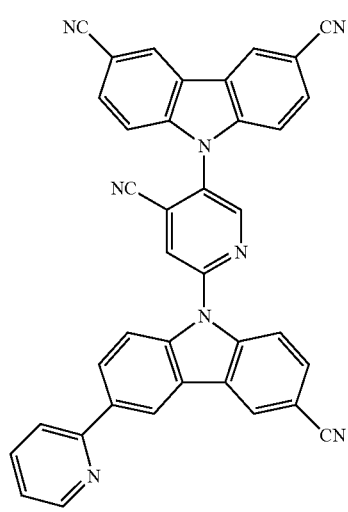
TBD-15
Group II
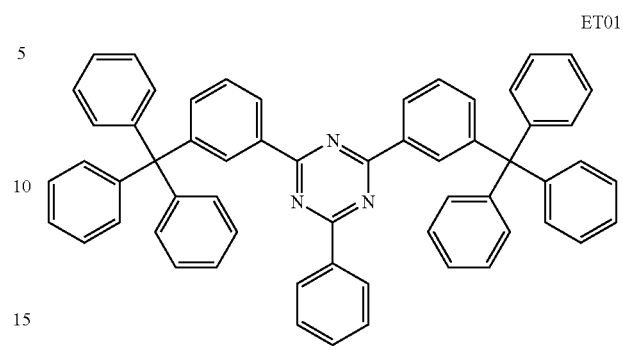
ET01
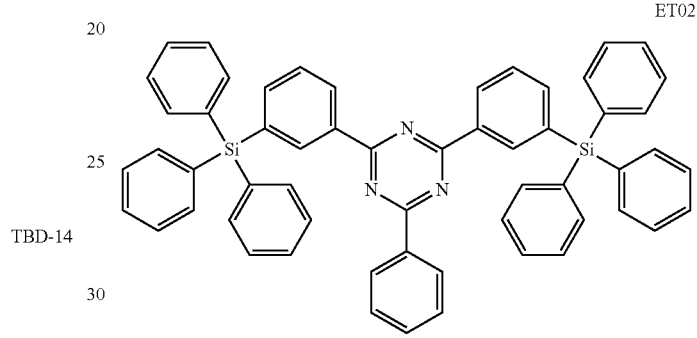
ET02
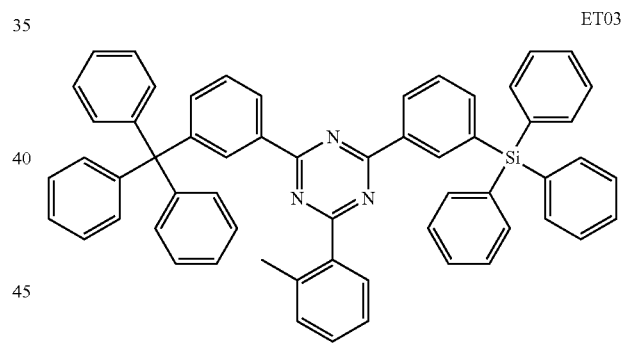
ET03
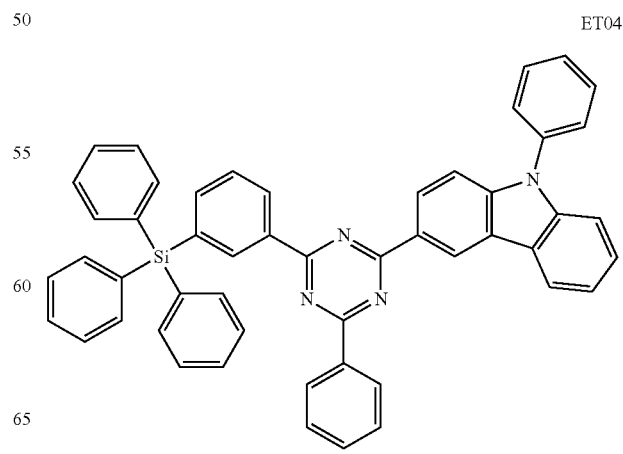
ET04

ET05
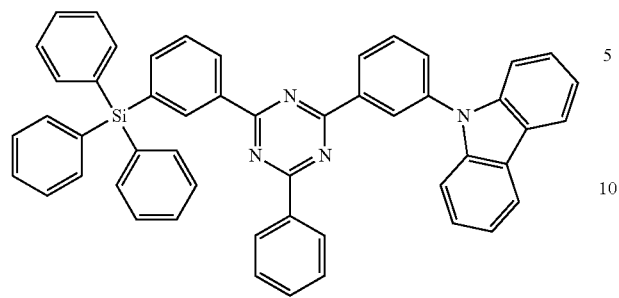
ET09
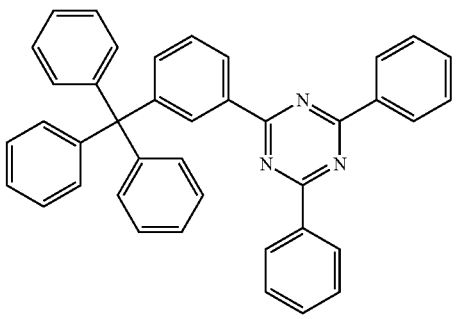
ET06
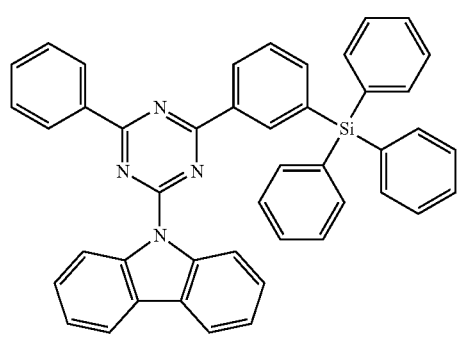
ET010
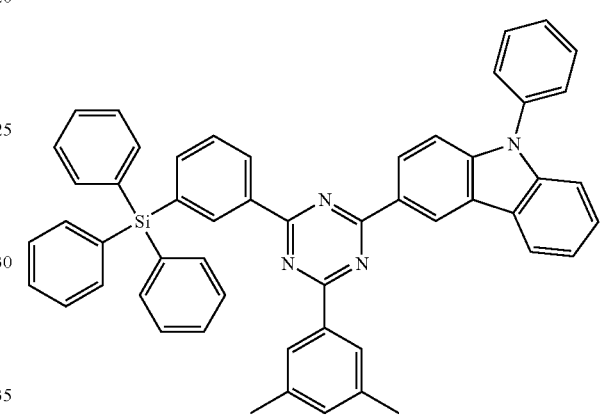
ET07
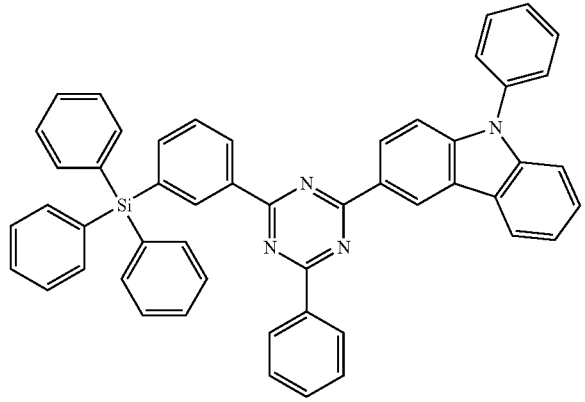
ET011
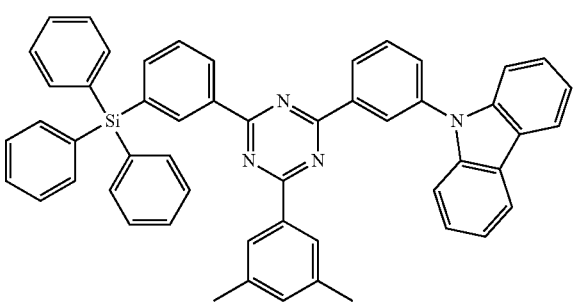
ET08
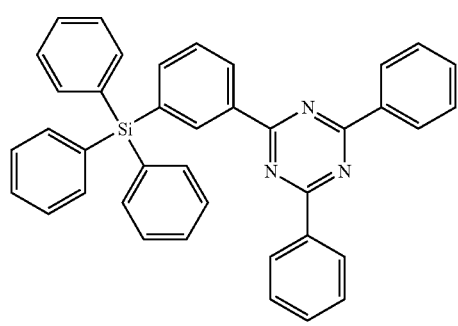
ET012
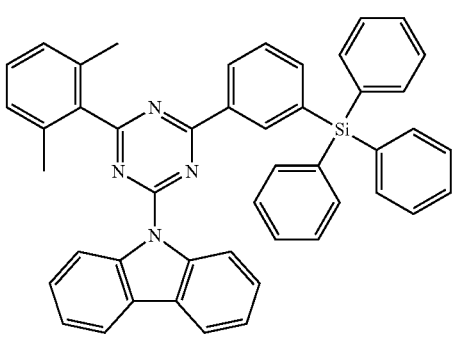

ET013
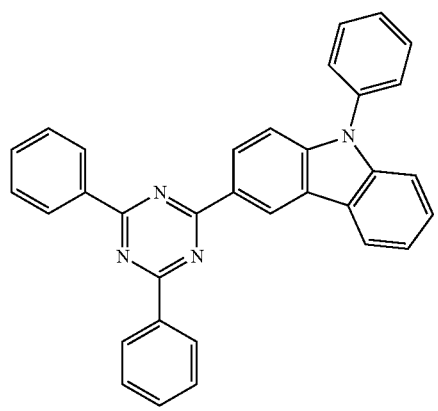
ET014
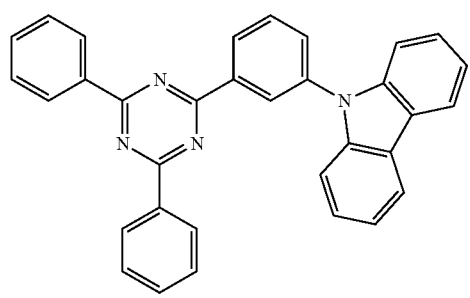
ET015
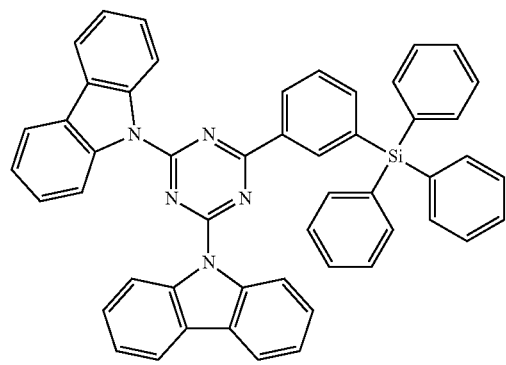
Group III
HT-01
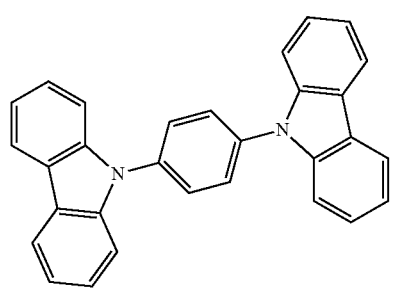
HT-02
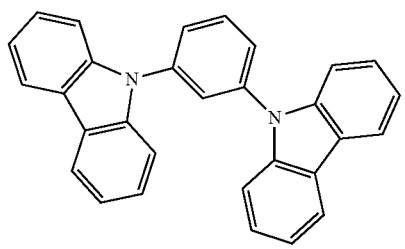
HT-03
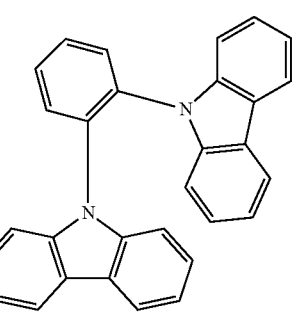
HT-04
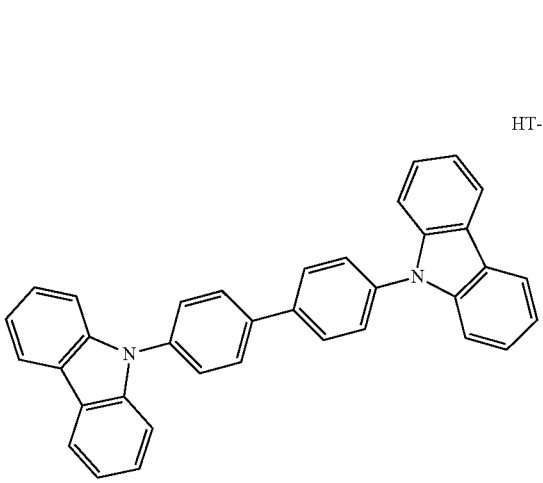
HT-05
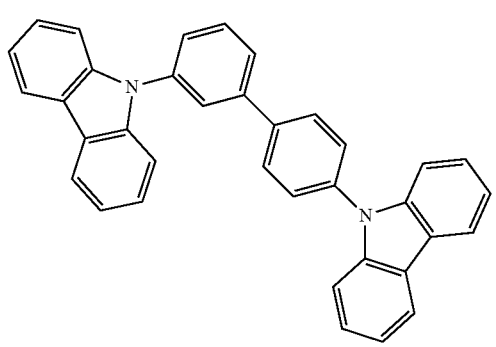

HT-06

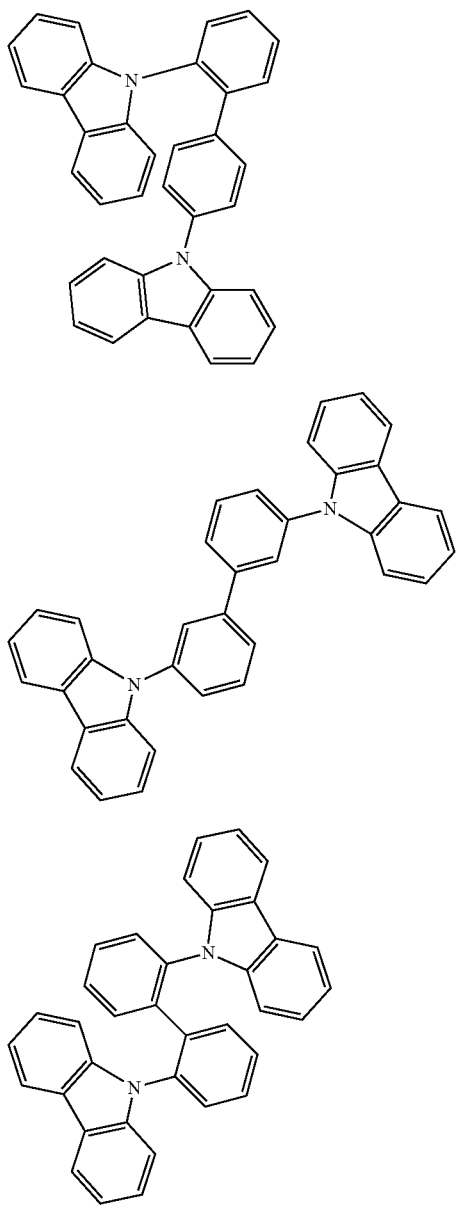

HT-07

HT-08

HT-09

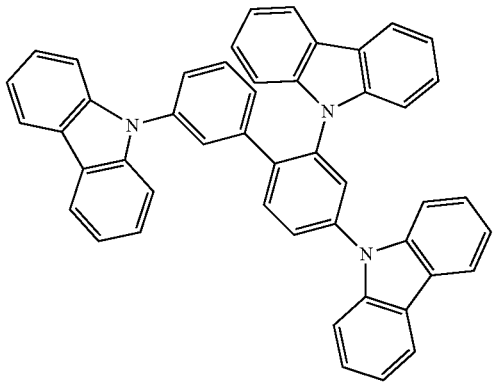

16. The organic light-emitting device of claim 1, wherein the first compound is a delayed fluorescence emitter.

17. The organic light-emitting device of claim 1, wherein the third compound has a maximum emission wavelength in a range of about 450 nanometers (nm) to about 550 nm.

18. The organic light-emitting device of claim 1, wherein the delayed fluorescence is in a range of about 450 nm to about 550 nm.

19. The organic light-emitting device of claim 1, wherein the first electrode is an anode,
the second electrode is a cathode, and
the organic layer further comprises a hole transport region between the first electrode and the emission layer and/or an electron transport region between the emission layer and the second electrode,
the hole transport region comprises a hole injection layer, a hole transport layer, an emission auxiliary layer, an electron blocking layer, or a combination thereof, and
the electron transport region comprises a hole blocking layer, an electron transport layer, an electron injection layer, or a combination thereof.

20. An apparatus comprising: a thin-film transistor comprising a source electrode, a drain electrode, and an active layer; and the organic light-emitting device of claim 1, wherein the first electrode of the organic light-emitting device is electrically connected to any one of the source electrode and the drain electrode of the thin-film transistor.

* * * * *